(12) United States Patent
Liff et al.

(10) Patent No.: US 12,142,510 B2
(45) Date of Patent: Nov. 12, 2024

(54) CARRIER FOR MICROELECTRONIC ASSEMBLIES HAVING DIRECT BONDING

(71) Applicant: Intel Corporation, Santa Clara, CA (US)

(72) Inventors: Shawna M. Liff, Scottsdale, AZ (US); Johanna M. Swan, Scottsdale, AZ (US); Adel A. Elsherbini, Tempe, AZ (US); Michael J. Baker, Gilbert, AZ (US); Aleksandar Aleksov, Chandler, AZ (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 808 days.

(21) Appl. No.: 17/132,429

(22) Filed: Dec. 23, 2020

(65) Prior Publication Data
US 2022/0199450 A1  Jun. 23, 2022

(51) Int. Cl.
H01L 21/683  (2006.01)
H01L 21/67  (2006.01)
H01L 23/00  (2006.01)

(52) U.S. Cl.
CPC .... H01L 21/6833 (2013.01); H01L 21/67092 (2013.01); H01L 24/75 (2013.01);
(Continued)

(58) Field of Classification Search
CPC .......... H01L 21/6833; H01L 21/67144; H01L 21/67029; H01L 21/683; H01L 24/75; H01L 2224/75985; H01L 2224/75983
(Continued)

(56) References Cited

U.S. PATENT DOCUMENTS

| 4,395,451 A | 7/1983 | Althouse |
| 4,667,944 A | 5/1987 | Althouse |

(Continued)

FOREIGN PATENT DOCUMENTS

| CN | 110544656 A | 12/2019 |
| CN | 111370349 B | 9/2020 |

(Continued)

OTHER PUBLICATIONS

Hashiguchi et al., "Self-Assembly and Electrostatic Carrier Technology for Via-Last TSV Formation Using Transfer Stacking-Based Chip-to-Wafer 3-D Integration," IEEE Transactions on Electron Devices, vol. 64, No. 12, pp. 5065-5072, Dec. 2017.

(Continued)

*Primary Examiner* — Kevin J Comber
(74) *Attorney, Agent, or Firm* — Akona IP PC

(57) ABSTRACT

Described herein are carrier assemblies, and related devices and methods. In some embodiments, a carrier assembly includes a carrier; a textured material including texturized microstructures coupled to the carrier; and microelectronic components mechanically coupled to the texturized microstructures. In some embodiments, a carrier assembly includes a carrier having a front side and a back side; an electrode on the front side of the carrier; a dielectric material on the electrode; a charging contact on the back side coupled to the electrode; and microelectronic components electrostatically coupled to the front side of the carrier. In some embodiments, a carrier assembly includes a carrier having a front side and a back side; electrodes on the front side; a dielectric material including texturized microstructures on the electrodes; charging contacts on the back side coupled to the plurality of electrodes; and microelectronic components mechanically and electrostatically coupled to the front side of the carrier.

20 Claims, 17 Drawing Sheets

(52) U.S. Cl.
CPC ............... *H01L 2224/75983* (2013.01); *H01L 2224/75985* (2013.01)

(58) Field of Classification Search
USPC ........................................................ 361/234
See application file for complete search history.

(56) References Cited

U.S. PATENT DOCUMENTS

| | | | |
|---|---|---|---|
| 8,253,230 | B2 | 8/2012 | Janzen et al. |
| 8,333,860 | B1* | 12/2012 | Bibl ..................... H01L 24/75 |
| | | | 156/273.1 |
| 9,159,595 | B2 | 10/2015 | Hurley et al. |
| 2007/0004171 | A1 | 1/2007 | Arana et al. |
| 2007/0077728 | A1 | 4/2007 | Kulkarni et al. |
| 2009/0023243 | A1* | 1/2009 | Koyanagi ............... H01L 24/95 |
| | | | 700/121 |
| 2009/0254213 | A1* | 10/2009 | Domon ............. H01L 21/67132 |
| | | | 700/228 |
| 2014/0159066 | A1 | 6/2014 | Hu et al. |
| 2014/0241843 | A1* | 8/2014 | Golda .................... H01L 24/75 |
| | | | 414/800 |
| 2015/0061100 | A1 | 3/2015 | Beer et al. |
| 2016/0240516 | A1 | 8/2016 | Chang et al. |
| 2017/0345692 | A1* | 11/2017 | Liu ...................... H01L 25/167 |
| 2018/0158706 | A1 | 6/2018 | Hsu et al. |
| 2018/0294178 | A1 | 10/2018 | Brun |
| 2018/0374736 | A1 | 12/2018 | Kumar et al. |
| 2019/0148188 | A1 | 5/2019 | Chang et al. |
| 2019/0189496 | A1* | 6/2019 | Chen ...................... B65G 47/90 |
| 2019/0206714 | A1* | 7/2019 | Hsiang ............... H01L 21/6831 |
| 2019/0244846 | A1 | 8/2019 | Hsieh et al. |
| 2020/0119251 | A1 | 4/2020 | Yohannes et al. |
| 2020/0203558 | A1 | 9/2020 | Chen et al. |
| 2022/0019943 | A1 | 1/2022 | Chaudhari et al. |
| 2022/0199449 | A1 | 6/2022 | Baker et al. |

FOREIGN PATENT DOCUMENTS

| | | | |
|---|---|---|---|
| DE | 102018125903 | A1 | 4/2020 |
| DE | 102018127123 | A1 | 4/2020 |
| WO | 2017052653 | A1 | 3/2017 |

OTHER PUBLICATIONS

Kim et al., "7. Soft nanocomposite electroadhesives for digital micro- and nanotransfer printing," Science Advances, Oct. 11, 2019 : EAAX4790.

Landsberger et al., Substrate Handling Techniques for Thin Wafer Processing. In: Burghartz J. (eds) Ultra-thin Chip Technology and Applications. Springer, New York, NY. (2011) (pp. 125-138) at pp. 134-136).

Tatari, Milad, "Dynamically Tunable Dry Adhesion via Subsurface Stiffness Modulation", A thesis, University of Nevada, Reno, Aug. 2018, 78 pages.

Wang, Yue et al., "Strong Wet and Dry Adhesion by Cupped Microstructures", ACS Appl.Mater.Interfaces 2019, 11, 26483-26490.

Executed European Search Report in European Patent Application 21197671.7 dated Feb. 28, 2022, 8 pages.

Ding, Kai et al, "Micro-LEDs, a Manufacturability Perspective", Appl. Sci. 2019; 9, 1206, 15 pages.

* cited by examiner

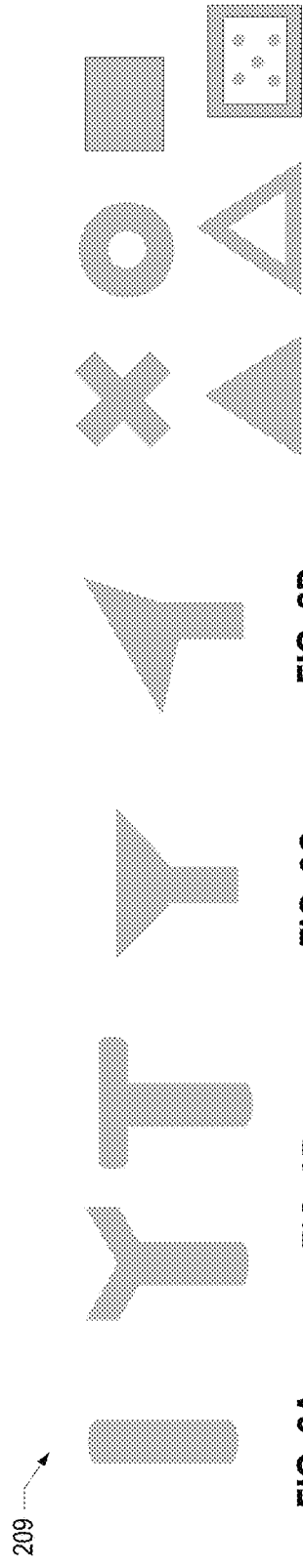
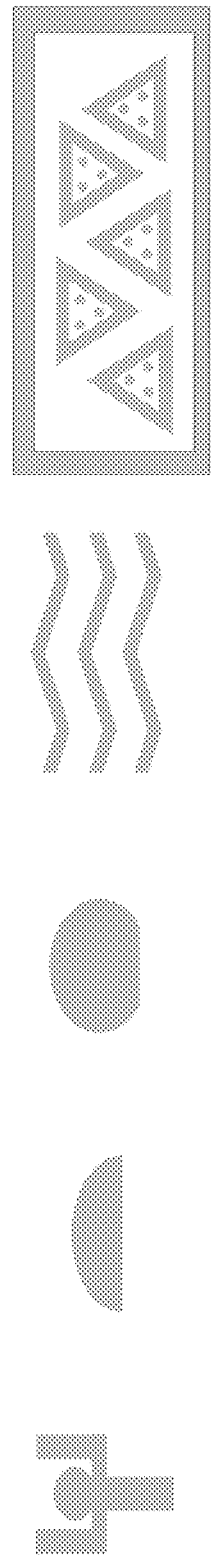
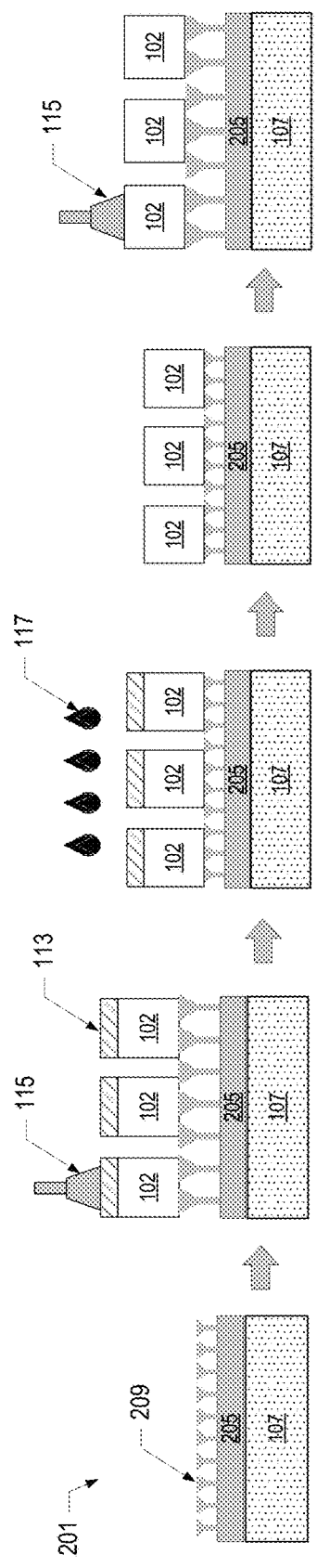

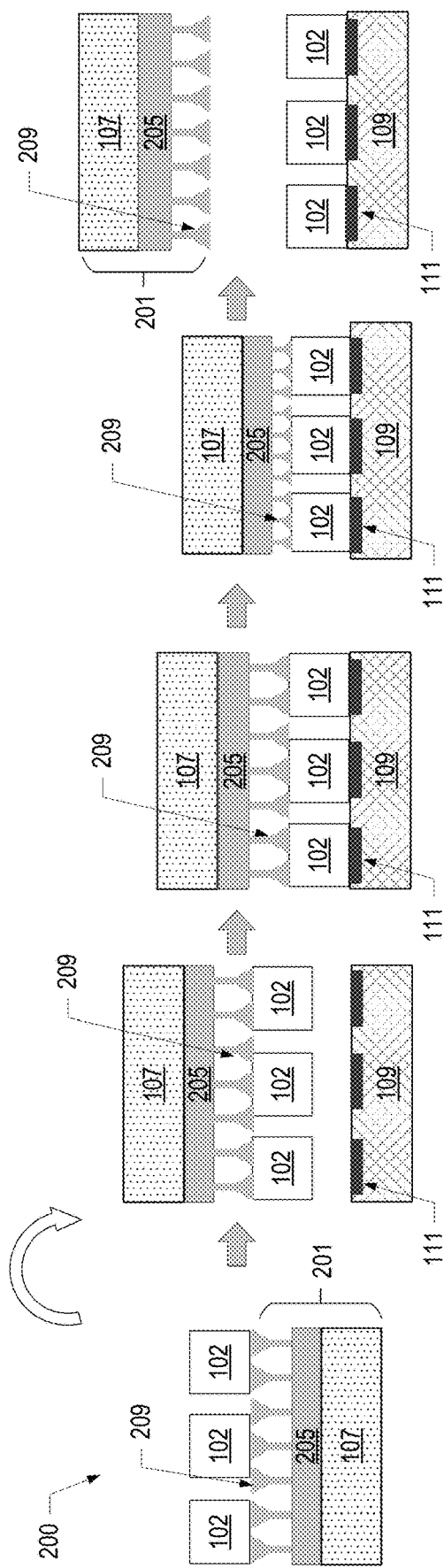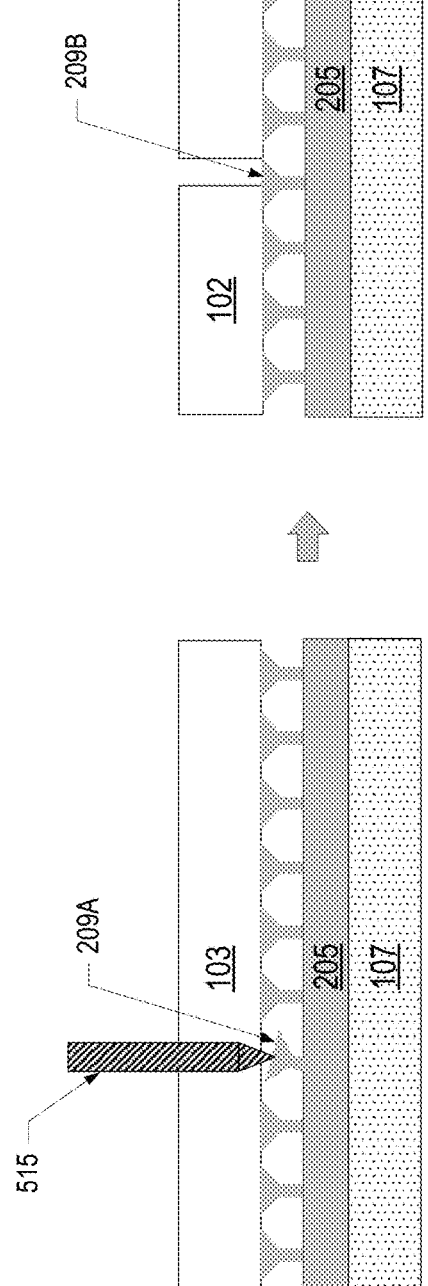

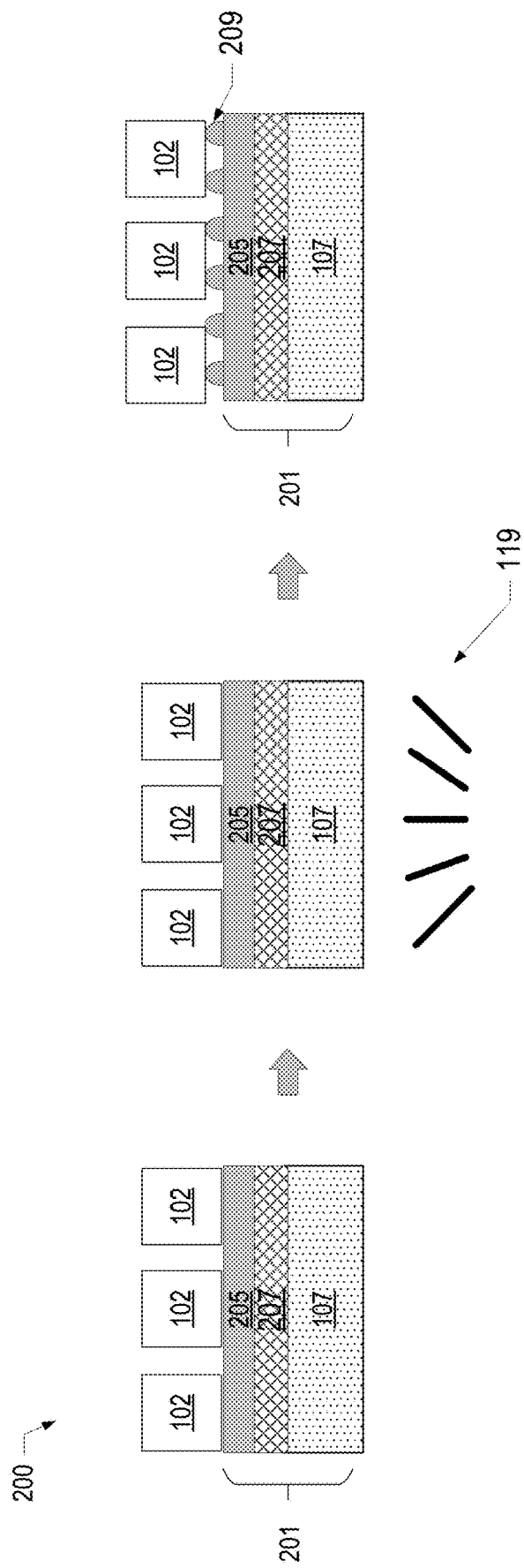

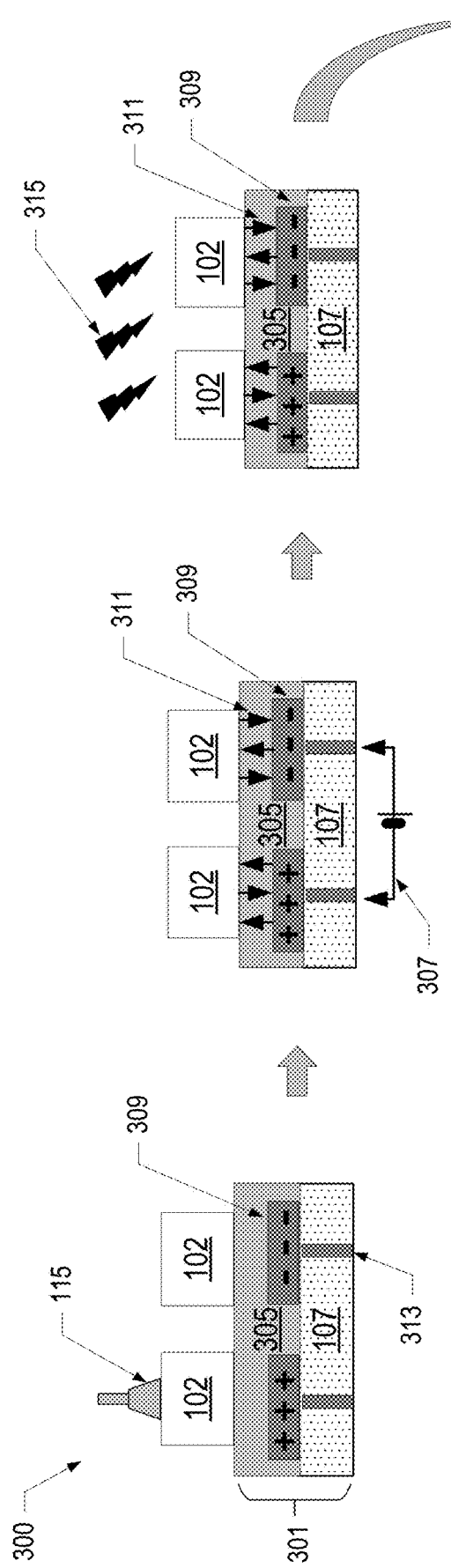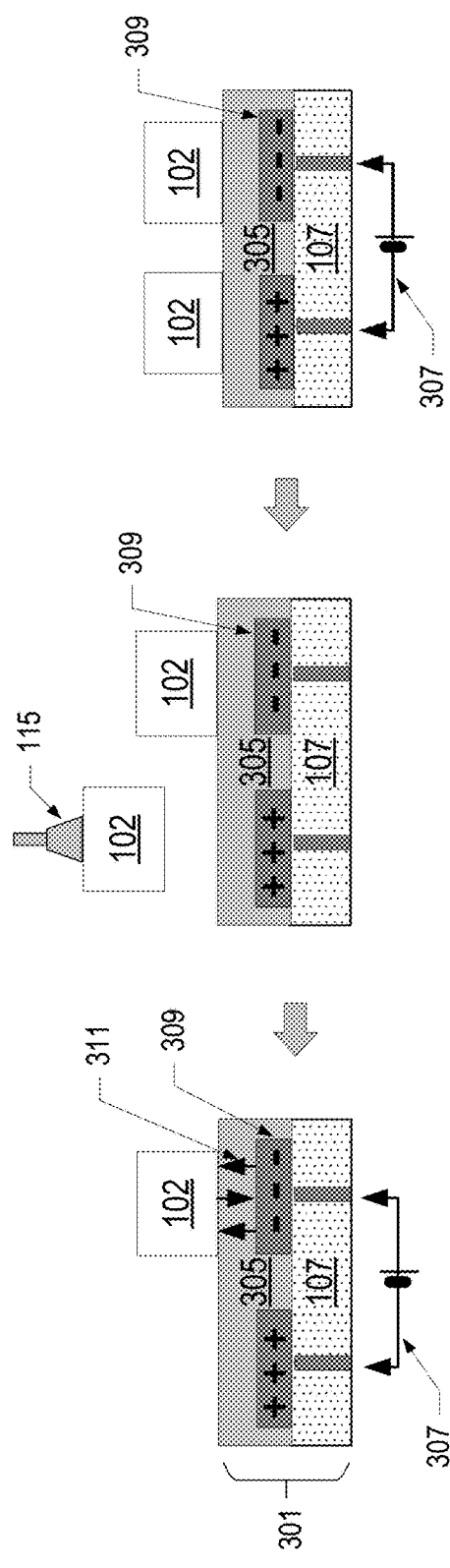

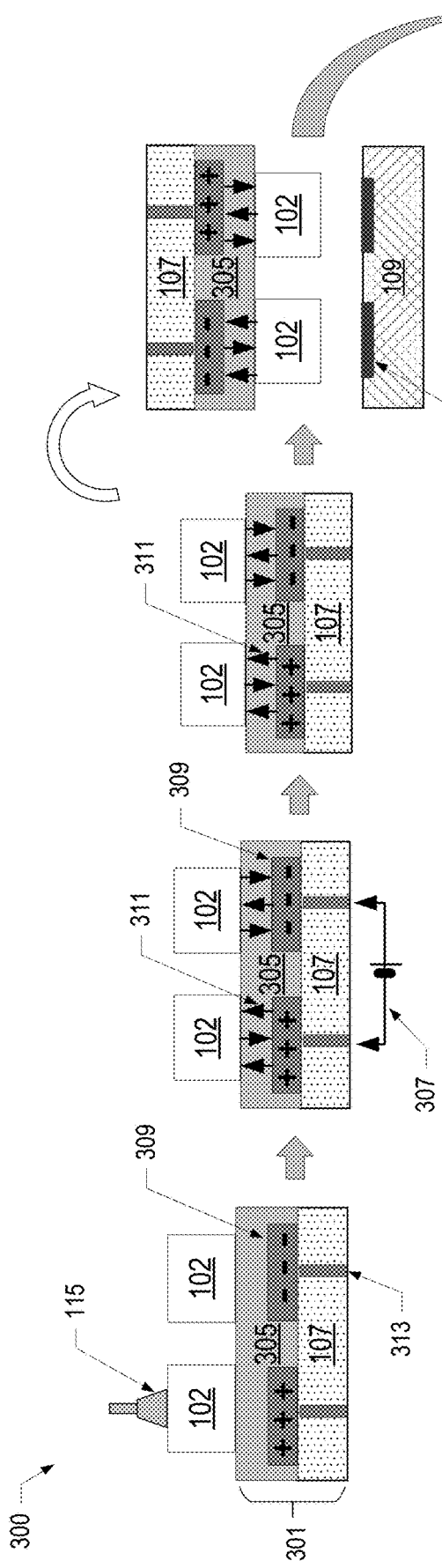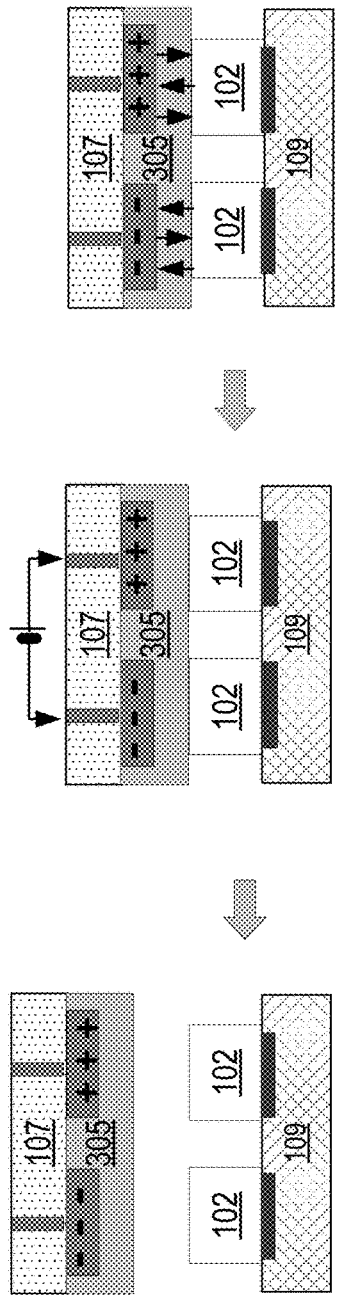

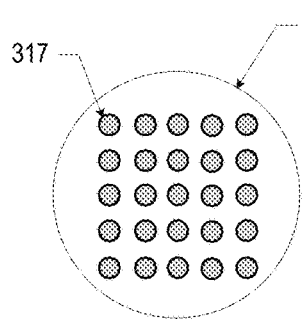 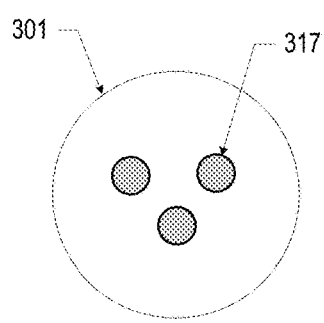 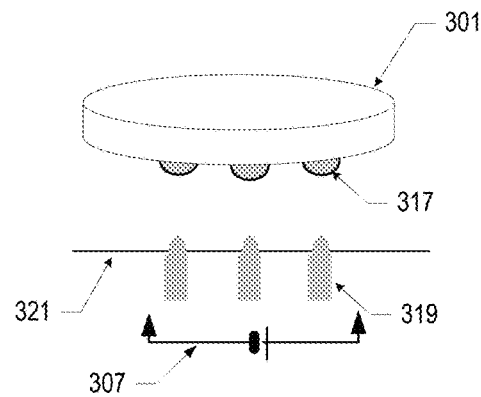
FIG. 11A  FIG. 11B  FIG. 11C
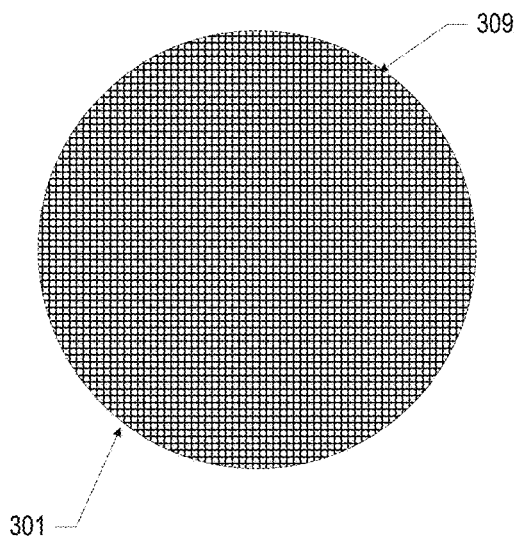 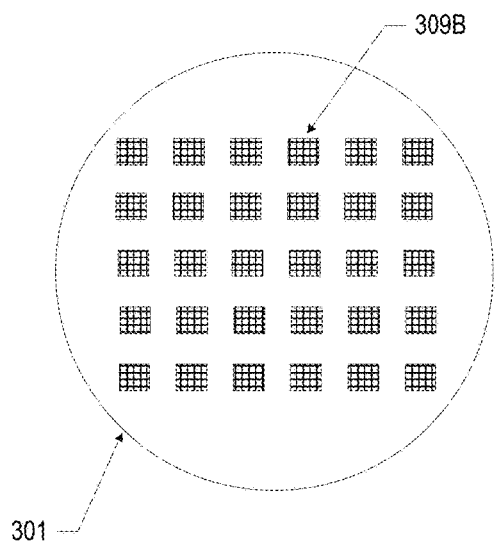
FIG. 12A  FIG. 12B

CARRIER FOR MICROELECTRONIC ASSEMBLIES HAVING DIRECT BONDING

BACKGROUND

The fabrication and assembly of integrated circuit devices typically includes using vacuum nozzle-based carrier systems for transferring and placing dies.

BRIEF DESCRIPTION OF THE DRAWINGS

Embodiments described herein illustrated by way of example and not limitation in the figures of the accompanying drawings, in which like references indicate similar features. The following figures are illustrative, and other processing techniques or stages can be used in accordance with the subject matter described herein. The accompanying drawings are not necessarily drawn to scale. Furthermore, some conventional details have been omitted so as not to obscure from the inventive concepts described herein.

FIGS. 2A-2J are schematics of example texturized microstructures of a textured carrier, in accordance with various embodiments.

FIGS. 3A-3E are side, cross-sectional views of various stages of an example microelectronic component assembly process using a textured carrier, in accordance with various embodiments.

FIGS. 4A-4E are side, cross-sectional views of various stages of an example microelectronic component assembly process using a textured carrier, in accordance with various embodiments.

FIGS. 5A and 5B are side, cross-sectional views of an example microelectronic component singulating process using a textured carrier, in accordance with various embodiments.

FIGS. 7A-7C are side, cross-sectional views of example textured carrier assemblies including an actuated material, in accordance with various embodiments.

FIGS. 9A-9F are side, cross-sectional views of various stages of an example microelectronic component assembly process using an electrostatic carrier, in accordance with various embodiments.

FIGS. 10A-10G are side, cross-sectional views of various stages of an example microelectronic component assembly process using an electrostatic carrier, in accordance with various embodiments.

FIGS. 11A-11C are back side views and a side view of an example arrangement of charging contacts on an electrostatic carrier, in accordance with various embodiments.

FIGS. 12A and 12B are top views of example arrangements of electrodes on a front side of an electrostatic carrier, in accordance with various embodiments.

DETAILED DESCRIPTION

Figure 1A:
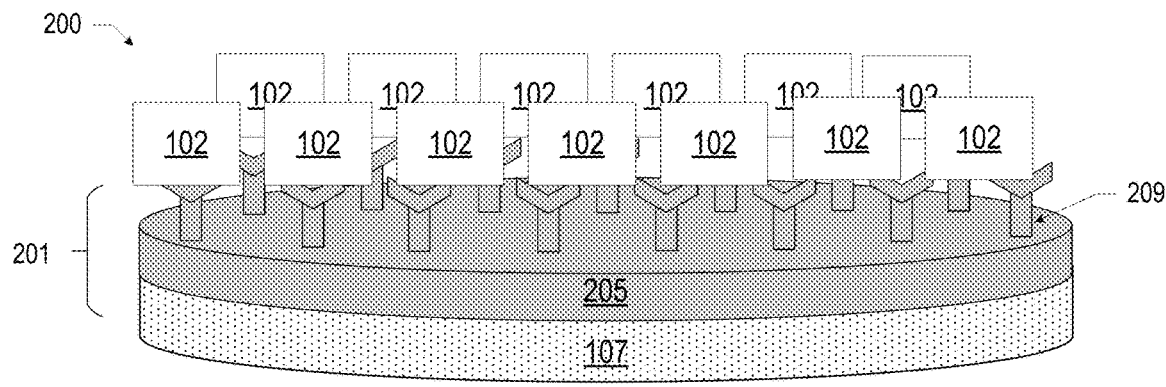
FIGS. 1A and 1B are perspective views of example textured carrier assemblies, in accordance with various embodiments.

Microelectronic component carrier assemblies, as well as related systems and methods, are disclosed herein. In some embodiments, a carrier assembly includes a carrier; a textured material coupled to the carrier and including texturized microstructures; and a plurality of microelectronic components mechanically and removably coupled to the texturized microstructures. In some embodiments, a carrier assembly includes a carrier having a front side and an opposing back side; an electrode on the front side of the carrier; a high permittivity dielectric material on the electrode and the carrier; a charging contact on the back side of the carrier electrically coupled to the electrodes; and a plurality of microelectronic components electrostatically coupled to the front side of the carrier. In some embodiments, a carrier assembly includes a carrier having a front side and an opposing back side; a plurality of electrodes on the front side of the carrier; a high permittivity dielectric material on the plurality of electrodes and the carrier, wherein the high permittivity dielectric material includes texturized microstructures; a plurality of charging contacts on the back side of the carrier coupled to the plurality of electrodes; and a plurality of microelectronic components mechanically and electrostatically coupled to the front side of the carrier.

The demand for higher performance IC devices at a lower cost is requiring more precise and higher-throughout manufacturing. In particular, IC devices having direct bonding generally require microelectronic components to be transferred and placed precisely without particle generation or an electrical static event. An advantage to leveraging die-to-wafer direct bonding is to shrink the interconnect pitch and drive tighter placement accuracies, which in turn, drives more precision and cleanliness in the manufacturing process. Die to wafer direct bonding requires a high level of cleanliness with minimum particle generation (e.g., an ISO clean room classification of ISO 3 or better and adding less than ten particles per wafer processed having a particle diameter greater than one hundred times smaller than the pitch). Die prep and singulation is an especially dirty process (e.g., often taking place in a cleanroom with greater than an ISO 6 clean room classification and generating more than thousands particles per wafer processed having a particle diameter greater than two hundred nanometers, such that ISO 3 level cleanliness is not achievable without additional cleaning steps and/or the use of protection layers, which require wet or dry chemical etches. Conventional carrier methods and technology are not able to meet these critical wafer level processing requirements, are not transferable across multiple direct bonding manufacturing processes, and are not able to meet the high throughput standards (e.g., greater than 3000 die placements per hour at placement accuracies of less than or equal to 200 nanometers). Further, handling and placing a die sized to less than 200 microns with traditional vacuum nozzle based systems is impractical due to dominating surface forces. Current die feeding methods, such as tape and reel, generate substantial amounts of particles due to die rubbing and current die pick-up technologies often use needles to eject the die, which stretches the tape and risks cracking a thin die and slows tool run rates. Alternatively feeding the die on wafer carrier with photoresist-based or thermal adhesives risks the die shifting and requires subsequent cleaning steps to remove the adhesive before subsequent processing, which slows run rates and productivity. As such, conventional carrier methods and technology have become throughput limiters and a large source of yield based defects. For example, the traditional use of dicing tape and a tape ring frame requires needle eject and stretching of the tape for die pick up. The needle eject release limits die time on the tape and tape reusability is usually limited to a few stretches and picks. Run rate is reduced due to needle eject time and die cracks or breaks are more likely when the die is very thin. In another example, the traditional use of tape and reel can provide excellent run rate enhancements for die placement, but the tape generally produces particle residue, which can contaminate a die. Although tape and reel performs well for build-to-order and sit time solutions, it does not perform well for securing ultra-thin die in reel. Moreover, with tape and reel, there is a risk of a die-out-of-pocket sticking to the cover tape or poor pick-ability due to die warp in the reel pocket, and, if the dies are large and the radius of the reel is too small, there is a risk that the dies crack or break when winding the tape around the reel. In a further example, using a thermal adhesive or photoresist on carrier does not allow for direct bonding, only collective bonding, because one side of the die will have residue from the thermal adhesive or photoresist. There is a risk of thermal dry out of a photoresist when reconstituting singulated dies on a carrier and a photoresist requires special lighting in the die placement equipment not to negatively impact the material. There is a further risk of die slip on placement and upon collective bond, especially if slight thermals are needed to allow compressibility to accommodate the various chip thickness tolerance. Also, the use of a thermal adhesive or photoresist requires additional processing, where, after collective bonding, a thermal or solvent release and subsequent clean step is required to eliminate the thermal adhesive or photoresist. A cleaner and more flexible technology to handle and place a die during wafer level processing that allows for direct bonding, individually and collectively, may be desired.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). For ease of discussion, the drawings of FIGS. 3A-3E may be referred to herein as "FIG. 3" and the drawings of FIGS. 4A-4E may be referred to herein as "FIG. 4," etc.

Figure 1B:
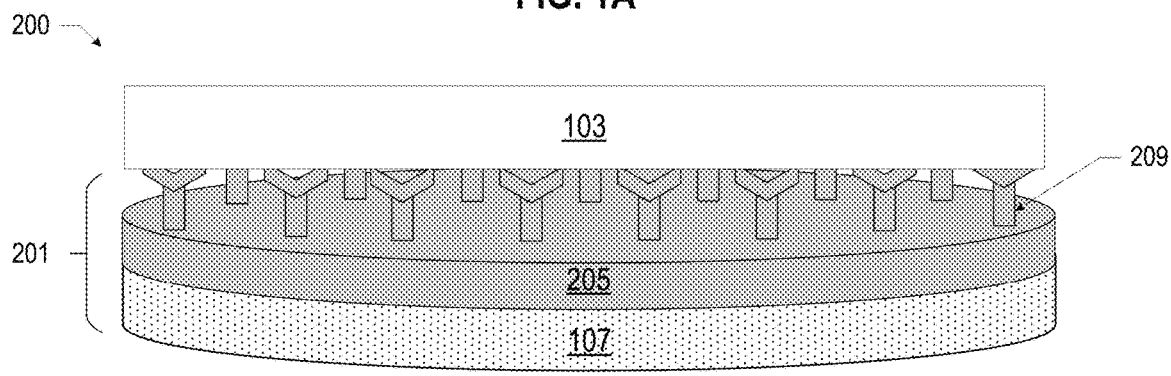
Figure 1C:
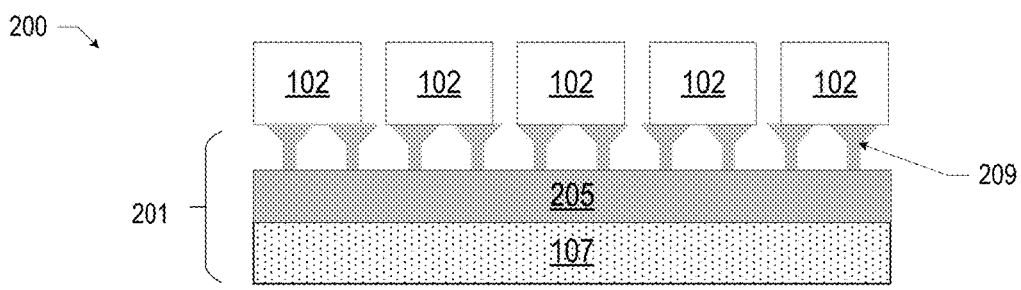
FIGS. 1C and 1D are side, cross-sectional views of the example textured carrier assemblies of FIGS. 1A and 1B, respectively.
Figure 1D:
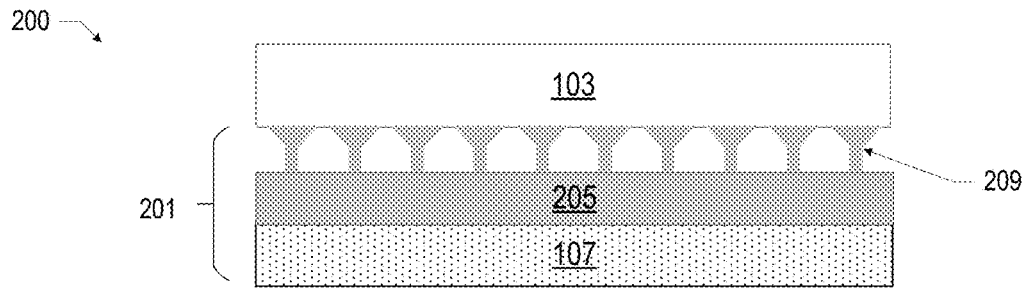

FIGS. 1A and 1B are perspective views of an example textured carrier assembly, in accordance with various embodiments. As shown in FIG. 1A, a textured carrier assembly 200 may include a textured carrier 201 including a carrier 107 and a textured material 205 having texturized microstructures 209, and a plurality of microelectronic components 102 mechanically coupled to the textured carrier 201 via the texturized microstructures 209. As shown in FIG. 1B, a textured carrier assembly 200 may include a textured carrier 201 including a carrier 107 and a textured material 205 having texturized microstructures 209, and a microelectronic component 103 mechanically coupled to the textured carrier 201 via the texturized microstructures 209. FIGS. 1C and 1D are side, cross-sectional views of the example textured carrier assemblies 200 of FIGS. 1A and 1B, respectively. The carrier 107 may include any suitable size and shape, for example, the carrier 107 may be circular as shown in FIG. 1 or may be rectangular-shaped, or triangular-shaped, etc. The carrier 107 may include any suitable material, and, in some embodiments, may include silicon (e.g., a silicon wafer), glass (e.g., a glass panel), or other semiconductor materials. The carrier 107 may be compatible with 300 millimeter SEMI standards. The textured material 205 may be made of any suitable material. In some embodiments, the textured material 205 and the texturized microstructures 209 may be formed directly on the carrier 107. In some embodiments, the textured material 205 and a material of the texturized microstructures 209 may be a same material. In some embodiments, the textured material 205 may be patterned on the carrier 107, such that the textured material 205 may be discontinuous (e.g., the carrier 107 may have a first area including the textured material 205 and a second area not including the textured material 205). In some embodiments, the texturized microstructures 209 may be patterned on the textured material 205, such that the texturized microstructures 209 may be discontinuous on the textured material 205 (e.g., the textured material 205 may have a first area including the texturized microstructures 209 and a second area not including the texturized microstructures 209). In some embodiments, the textured material 205 may include a dry adhesive material having texturized microstructures 209. In some embodiments, a dry adhesive material may not include tacky or adhesive properties when applied as a planarized material layer, but may include tacky or adhesive properties when it includes texturized microstructures material, which further may enable tunable adhesion in the shear and normal direction. The dry adhesive material may be imprinted, molded, lithographically patterned, or laminated on the carrier 107. The dry adhesive material may include an elastomer, a rubber, a urethan, a urethane copolymer, an acrylate, an acrylate copolymer, a silicon, a silicon copolymer, and combinations thereof. In some embodiments, the dry adhesive material may be selected based on its material property of having very little outgassing, for example, materials containing polytetrafluoroethylene (PFE), santoprene, chloroprene, poron, or a fluoroelastomer which are compatible with semiconductor manufacturing cleanrooms. In some embodiments, the textured material 205 may include an actuatable material that is activated to generate the texturized microstructures 209, for example, an elastomer with a light or heat activated porogen may be leveraged or shape memory polymer composite may be leveraged. The actuatable material may be activated to generate texturized microstructures 209 when exposed to one or more of ultraviolet radiation, increased temperature (e.g., heat), and infrared light. The actuatable material may be coupled to the carrier 107 as a solid or patterned, multi-layer coating or as a pressure-sensitive film, and may be activated subsequent to being coupled to the carrier 107. In some embodiments, the microelectronic components 102, 103 may be attached to the actuatable material prior to activation and, upon activation, the actuatable material may develop texturized microstructures 209 that facilitate in detaching or releasing the microelectronic components 102, 103 from the textured carrier 201, as described below with reference to FIG. 7. The actuatable material is likely a single-use material such that, once the actuatable material is used to attach and detach a microelectronic component 102, 103, the actuatable material is removed from the carrier 107 and a new (e.g., unused) yet to be actuated material is coupled to the carrier 107. In some embodiments, the textured material 205 may include a base material (e.g., a first material) that may provide structural rigidity or stiffness and a coating or top spatula material (e.g., a second material) that may provide elasticity.

The texturized microstructures 209 may have any desired shape and dimensions. In some embodiments, the texturized microstructures 209 may have a thickness (e.g., z-height) between 100 nanometers and 150 microns. The texturized microstructures 209 may be formed to optimize attach and detach properties of microelectronic components 102, 103 with the structures. For example, a height to diameter ratio of a texturized microstructure 209 may tuned to enable elastomeric deformation and avoid plastic deformation. In another example, the texturized microstructures 209 and textured material 205 may be tuned for adhesion and resistance such that the microelectronic components 102, 103 are unlikely to release under shear forces when spinning or under gravitational forces when flipped. The texturized microstructures 209 FIGS. 2A-2J are schematics of example texturized microstructures 209, in accordance with various embodiments. In the embodiment of FIG. 2A, the texturized microstructure 209 may be a pillar having a circular footprint. The pillar-shaped texturized microstructure 209 may have any desired cap shape (e.g., contact surface). For example, in the embodiment of FIG. 2B, the pillar has a V-shaped cap or a flat cap to form a T-shaped microstructure, in the embodiment of FIG. 2C, the pillar has a suction cup for a cap, and in the embodiment of FIG. 2D, the pillar has a tilted or asymmetrical cap. The texturized microstructure 209 may have any desired footprint. For example, the texturized microstructure 209 may have a circular-shaped, oval-shaped, or rectangular-shaped footprint, and, as shown in the embodiments in FIG. 2E, may further have a cross-shaped, a ring-shaped, a triangular-shaped, or a rectangular-shaped footprint. In some embodiments, the texturized microstructure 209 may include an outer portion (e.g., a perimeter wall or frame) and an inner portion, where the inner portion may be open (e.g., without textured material) and/or may further include additional individual texturized microstructures 209, such as pillars. In the of FIG. 2F, the texturized microstructure 209 includes a dome-shaped cap (e.g., a sphere within a cup similar to a suction cup on an octopus). In the embodiments of FIGS. 2B-2F, the texturized microstructure 209 may include a pillar having any desired thickness dimension or may not include a pillar and may include only the cap. FIGS. 2G and 2H show texturized microstructures 209 having a semi-circular shape and a spherical shape. In the embodiment of FIG. 2I, the texturized microstructures 209 are zigzagged or wavy lines, and, although FIG. 2I shows non-intersecting lines, in some embodiments, the lines may be intersecting. In some embodiments, the lines may have other geometries, such as linear and/or intermittent (e.g., dashed). The texturized microstructures 209 may be arranged in any desired manner, including symmetrical, asymmetrical, dense pack, a rectangular array, a triangular array, or a face-centered cubic array, as described below with reference to FIG. 6. The texturized microstructures 209 of the textured material 205 may include any suitable combination of these and other footprint shapes, sizes, and arrangements (e.g., hexagonal arrays, octagon footprints, etc.). In the embodiment of 2J, which shows an exemplary footprint of an arrangement of texturized microstructures 209, the texturized microstructures 209 may further include a perimeter structure, as depicted by the rectangular-shaped frame, and/or may further include one or more internal framing structures, as depicted by the triangle-shaped frames, such that one or more of the individual texturized structures 209 are included within the perimeter structure and/or the one or more internal framing structures. Although FIG. 2J shows the perimeter structure and the internal framing structures having particular sizes, shapes, and arrangements, the perimeter structure and the internal framing structures may have any suitable size, shape, and arrangement. For example, the perimeter structure may be circular-shaped and the internal framing structures may be rectangular-shaped. In some embodiments, the internal framing structures may have a same size and a same footprint as that of a microelectronic component 102. In some embodiments, the perimeter structure and/or one or more framing structures may be discontinuous, such that the individual texturized microstructures are not fully enclosed. In some embodiments, the perimeter structure may delineate a first area on the carrier including texturized microstructures 209 (e.g., within the perimeter structure) and a second area on the carrier not including texturized microstructures 209 (e.g., outside the perimeter structure that may include fiducials and other identifiers).

FIGS. 3A-3E are side, cross-sectional views of various stages of an example microelectronic component assembly process using a textured carrier, in accordance with various embodiments. The processes of FIG. 3 may be performed at room temperature. FIG. 3A illustrates a textured carrier 201 including a textured material 205 with texturized microstructures 209 mounted on a carrier 107. FIG. 3B illustrates an assembly subsequent to a pick and place head 115 providing microelectronic components 102 on the surface of the texturized microstructures 209 (e.g., the carrier is reconstituted with dies). As shown in FIG. 3B, the microelectronic components 102 may include a protective material 113 on a top surface. The pick and place head 115 may include vacuum pick-up, electrostatic pick-up, or dry adhesive pick, and may not include tape stretching and needle eject. To reduce or eliminate a static discharge event when picking a microelectronic component 102, the pick and place head 115 and/or the textured material 205 may further include an electrostatic dissipative material having a resistivity between $1 \times 10^6$ and $1 \times 10^{10}$ ohm-centimeters. For example, the electrostatic dissipative material may include conductive particles or a conductive layer may be deposited between the textured material 205 and the carrier 107. FIG. 3C illustrates an assembly subsequent to mechanically coupling the microelectronic components 102 to the carrier 107 via the texturized microstructures 209 on the textured material 205. The microelectronic components 102 may be mechanically couple by preloading, compressing, and/or elastically deforming the texturized microstructures 209 and tuning the surface energy of the microelectronic components 102 and the texturized microstructure 209. Subsequent to mechanically coupling the microelectronic components 102 to the carrier 107, the microelectronic components 102 may undergo additional processing, such as protective material 113 removal via heat, plasma or ultraviolet radiation, dry reactive etching, and/or wet etching, or solvent dissolution 117. FIG. 3D illustrates an assembly subsequent to removal of the protective material 113 from the microelectronic components 102. FIG. 3E illustrates an assembly (e.g., a textured carrier assembly 200 of FIG. 1) subsequent to detachment of the microelectronic components 102 from the texturized microstructures 209 by mechanical deformation and/or by the pick and place head 115 overcoming adhesive forces. The microelectronic components 102 may be detached and may be transfer to another destination wafer for direct bonding or further processing. As used herein, the terms destination wafer, target wafer, and destination side may be used interchangeably.

FIGS. 4A-4E are side, cross-sectional views of various stages of an example microelectronic component assembly process using a textured carrier, in accordance with various embodiments. The processes of FIG. 4 may be performed at room temperature. FIG. 4A illustrates an assembly (e.g., a textured carrier assembly 200 of FIG. 1) including a textured carrier 201 having a textured material 205 with texturized microstructures 209 mounted on a carrier 107 and microelectronic components 102 mechanically coupled to the textured carrier 201 via the texturized microstructures 209 (e.g., the textured carrier 201 is reconstituted with dies). In some embodiments, the textured carrier 201 may be reconstituted with microelectronic components 102 via a pick and place head. In some embodiments, the textured carrier 201 may be reconstituted with microelectronic components 102 by attaching to an array or a plurality of microelectronic components 102 on a temporary carrier and detaching the array of microelectronic components 102 from the temporary carrier as long as the adhesion energy of the individual microelectronic components 102 to the textured carrier 201 is greater than the adhesion energy of the individual microelectronic components 102 to the temporary carrier. FIG. 4B illustrates an assembly subsequent to flipping the assembly of FIG. 4A and aligning it with a destination wafer 109 including IC devices 111. The assembly of FIG. 4A may be aligned to the destination wafer 109, for example, using fiducials on the carrier 107. FIG. 4C illustrates an assembly subsequent to mating the microelectronic components 102 with the IC devices 111 on the destination wafer 109. In some embodiments, the microelectronic components 102 further may be coupled to the IC devices 111 via direct bonding. FIG. 4D illustrates an assembly subsequent to displacing the textured carrier 201 (e.g., downwards towards the destination wafer 109) to elastically deform the texturized microstructures 209 and release the microelectronic components 102. The texturized microstructures 209 and/or the textured material 205 may have elastic properties such that variations in a thickness of the microelectronic components 102 may be accommodated. In some embodiments, the texturized microstructures 209 and/or the textured material 205 may enable clean release (e.g., without leaving a residue) of the microelectronic components 102 as long as the adhesion energy of the microelectronic component 102 to the IC device 111 on the destination wafer 109 is greater than the adhesion strength of the microelectronic component 102 to the textured carrier 201. FIG. 4E illustrates an assembly subsequent to detaching the microelectronic components 102 from the textured carrier 201.

FIGS. 5A and 5B are side, cross-sectional views of an example microelectronic component singulating process using a textured carrier, in accordance with various embodiments. FIGS. 5A and 5B show that the texturized microstructures 209 are able to withstand the singulating process (e.g., blade or plasma dicing). FIG. 5A illustrates a textured carrier assembly 200 during blade dicing (e.g., singulating) of a microelectronic component 103 assembly where the texturized microstructures 209A are bent or moved by the dicing blade 515. FIG. 5B illustrates the assembly of FIG. 5A subsequent to singulating a microelectronic component 102 from the microelectronic component 103 where the texturized microstructures 209B recover to their original structure after the dicing process and do not undergo deleterious deformation or delamination. In some embodiments, the texturized microstructures 209 may be capable of withstanding additional processing, for example, cleaning processes including wet solvents, bases, or dry plasma etches, exposure to ultraviolet radiation, thermal exposures, spin drying, and plasma activation (e.g., direct bonding processes).

Figure 6A:
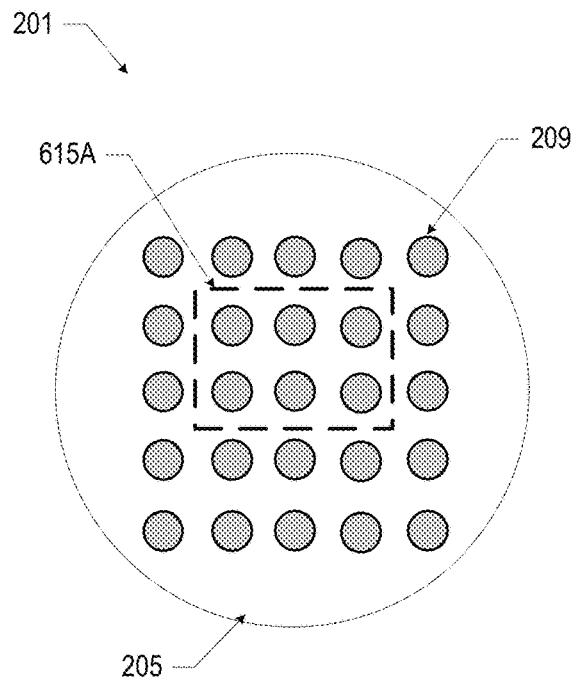
FIGS. 6A-6C are example arrangements of texturized microstructures of a textured carrier, in accordance with various embodiments.
Figure 6B:
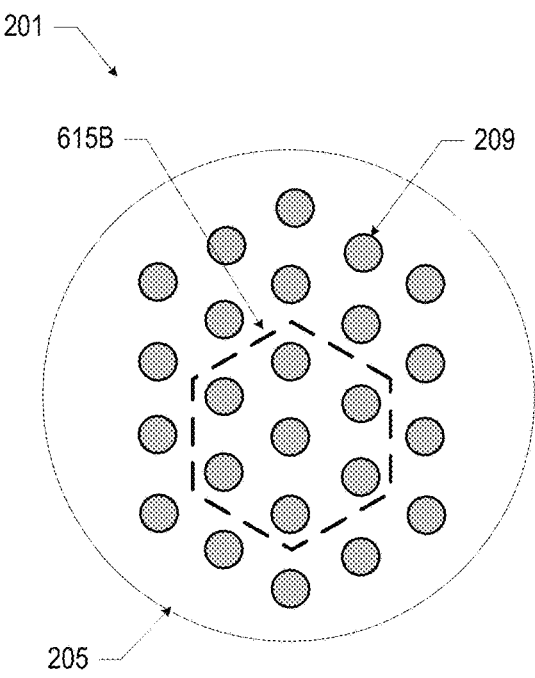
Figure 6C:
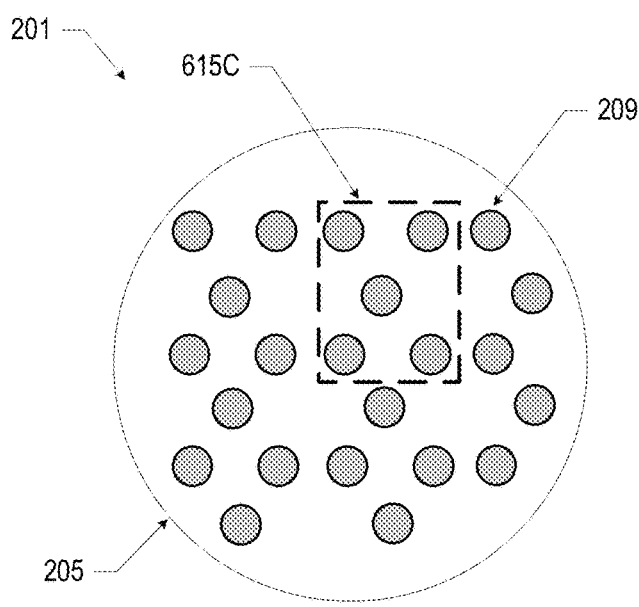

FIGS. 6A-6C are example arrangements of texturized microstructures of a textured carrier, in accordance with various embodiments. The texturized microstructures 209 may have any suitable arrangement and density. FIG. 6A illustrates a textured carrier 201 including a textured material 205 and texturized microstructures 209 arranged in an array or grid 615A. FIG. 6B illustrates a textured carrier 201 including a textured material 205 and texturized microstructures 209 arranged in a hexagonal array 615B. FIG. 6C illustrates a textured carrier 201 including a textured material 205 and texturized microstructures 209 arranged in a face-centered cubic array 615C. As described above with reference to FIG. 1, the textured material 205 and/or the texturized microstructures 209 may be patterned.

FIGS. 7A-7C are side, cross-sectional views of example textured carrier assemblies including an actuatable material to create or further accentuate the texturization, in accordance with various embodiments. The processes of FIG. 7 may be performed at room temperature. FIG. 7A illustrates a textured carrier assembly 200 including a textured carrier 201 having an actuatable material 205 and a structural, activation conduit material 207 mounted on a carrier 107 and microelectronic components 102 mechanically coupled to the textured carrier 201 via the actuatable material 205 (e.g., prior to activation the textured carrier 201 is reconstituted with dies but the actuatable material 205 may be largely non-textured). The structural, activation conduit material 207 may include any suitable material that aids activation and shape change of the actuatable material 205. For example, when activation occurs via ultraviolet exposure 119, the actuatable material 205 may include an ultraviolet-absorbing material, and when activation occurs via thermal or infrared exposure 119, the actuatable material 205 may include an infrared light absorbing or a light-to-heat conversion material, such as a polymeric material having carbon black or the addition of metal and oxide structures that cause shape change either through entropy recovery or activation of porogens or foaming agents or other similar mechanisms. When the activation occurs via thermal exposure, an activation temperature should be greater than a temperature of the preceding processes. FIG. 7B illustrates an assembly subsequent to exposing the bottom surface of the carrier 107 to ultraviolet radiation and/or infrared light and/or thermal exposure to activate the actuatable material 205 passing through the structural, activation conduit material 207. FIG. 7C illustrates the assembly of FIG. 7B subsequent to activation and forming texturized microstructures 209 changing the contact area to and enabling release of the microelectronic components 102, which may be removed from the textured carrier 201 via a pick and place head (not shown), as described above with reference to FIG. 3, or the textured carrier 201 may be removed after activation, as shown in FIG. 4E.

Figure 8A:
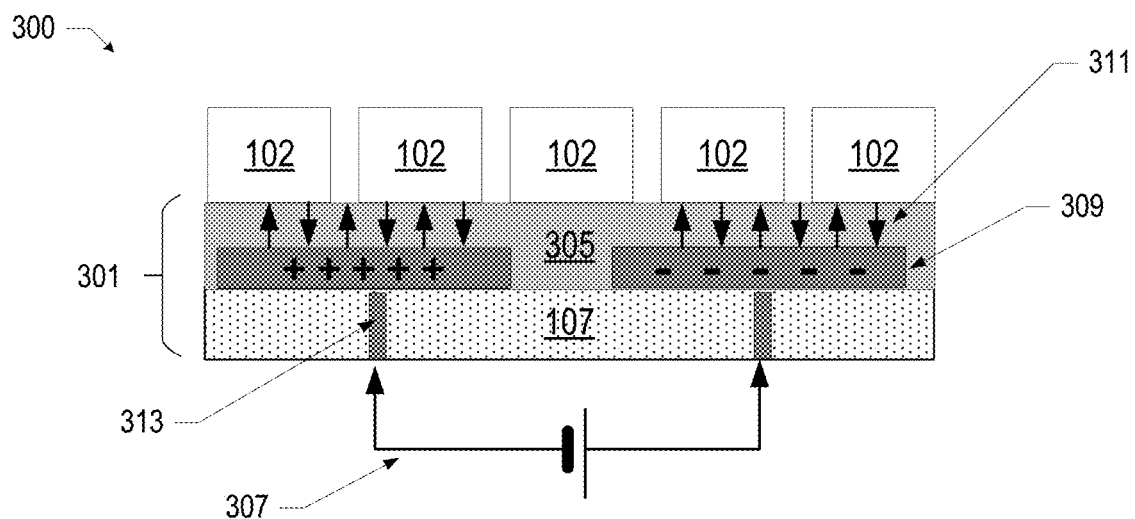
FIGS. 8A-8B are side, cross-sectional views of example electrostatic carrier assemblies, in accordance with various embodiments.
Figure 8B:
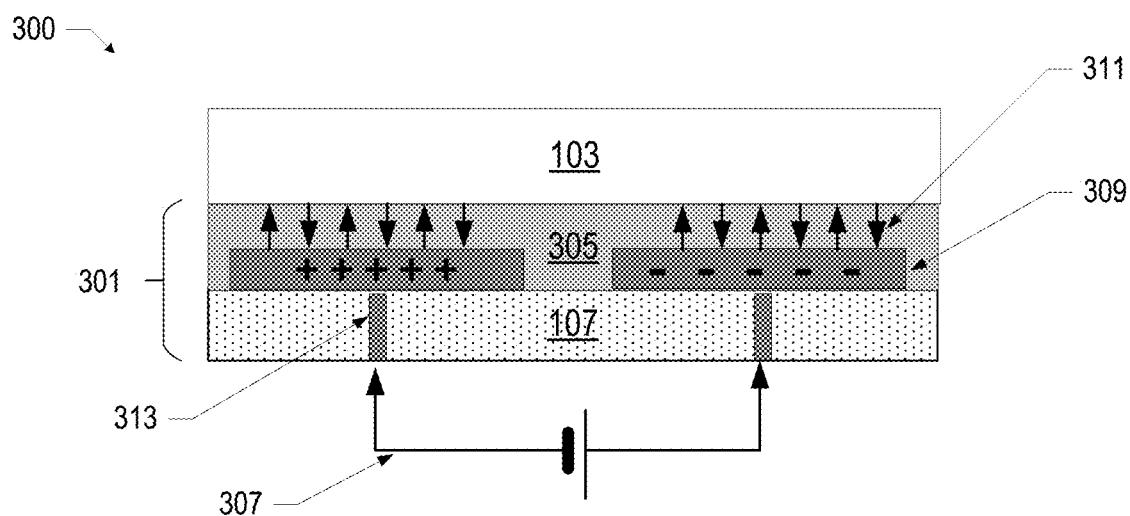

FIGS. 8A-8B are side, cross-sectional views of example electrostatic carrier assemblies, in accordance with various embodiments. As shown in FIG. 8A, an electrostatic carrier assembly 300 may include an electrostatic carrier 301 including a carrier 107, a high permittivity dielectric material 305 that holds electrostatic charge, and a plurality of electrodes 309, and a plurality of microelectronic components 102 electrostatically coupled 311 to the electrostatic carrier 301. As shown in FIG. 8B, an electrostatic carrier assembly 300 may include an electrostatic carrier 301 including a carrier 107, a high permittivity dielectric material 305, and a plurality of electrodes 309, and a microelectronic component 103 electrostatically coupled 311 to the electrostatic carrier 301. The carrier 107 may include any suitable material, and, in some embodiments, may include silicon (e.g., a silicon wafer), glass (e.g., a glass panel), silicon dioxide, silicon carbon nitride, silicon nitride, silicon oxynitride, or other semiconductor dielectric materials (e.g., a polyimide, ABF, an epoxy build up material, a printed circuit board (PCB) material). The carrier 107 may be compatible with 300 millimeter SEMI standards. The high permittivity dielectric material 305 may be made of any suitable dielectric material that is capable of holding electric charge during processing (e.g., having high dielectric permittivity) with a high dielectric break down strength, that may be easily polarized, and that may survive the thermal, plasma, and wet and dry etch conditions of downstream processing. In some embodiments, the high permittivity dielectric material 305 may include a dielectric compatible with glass processing temperatures (e.g., compatible with a glass carrier). For example, in some embodiments, the high permittivity dielectric material 305 may include a polyimide, a polyethylene, a polypropylene, a polystyrene, Teflon (PTFE), or other conjugated polymers. In some embodiments, the high permittivity dielectric material 305 may include metal oxides, such as titanium and oxygen (e.g., in the form of titanium oxide), or piezo electrics, such as strontium and titanium (e.g., in the form of strontium titanate), barium and strontium and titanium (e.g., in the form of barium strontium titanate), barium and titanium (e.g., in the form of barium titanate), or hafnium and oxygen (e.g., in the form of hafnium oxide), among others. In some embodiments, the high permittivity dielectric material 305 may include a dielectric compatible with traditional semiconductor processed materials (e.g., compatible with a silicon carrier), such as chemical vapor deposited dielectrics. In some embodiments, the high permittivity dielectric material 305 may include multiple layer of different high permittivity dielectric materials. The electrostatic carrier assembly 300 may be charged via the conductive pathways 313 through the electrostatic carrier 301 to charging contacts (e.g., charging contacts 317 of FIG. 11) (no shown) that couple to a charger 307. The conductive pathways 313 may include any suitable structure. In some embodiments, the conductive pathways 313 include through carrier vias (e.g., through substrate vias (TSVs)) that extend from the electrodes 309 to the back side of the carrier 107. In some embodiments, the conductive pathways 313 may further include routing through a redistribution layer (RDL) (not shown) on the carrier 107 that may couple two or more common electrodes to enable global or localized electrode charging (e.g., collective or individual electrode charging). In some embodiment, the RDL may be disposed on the back side of the carrier 107. In some embodiments, the RDL may be disposed between the back side of the carrier 107 and the electrodes 309. In some embodiments, the conductive pathways 313 may be routed from the electrodes 309 through the high permittivity dielectric material 305 to a front side (e.g., the microelectronic component 102, 103 coupling side) (not shown) and may further be routing such that the charging contacts are positioned along the outer edge of the electrostatic carrier 301 (not shown). The conductive pathways 313 may include any suitable conductive material, such as a metal. The electrostatic attractive force on the microelectronic component 102, 103 may be defined by Coulomb's Law formula $F=(\epsilon_0 \epsilon_r AU^2)/(8d^2)$, where F is the clamping force, $\epsilon_0$ is the permittivity of free space, $\epsilon_r$ is the dielectric constant of the high permittivity dielectric material 305 on the electrodes 309, d is the thickness of the high permittivity dielectric material 305 above the electrodes 309, A is the electrode area, and U is the applied voltage. To maximize the electrostatic holding force 311, a thickness d is minimized and the electrode area A is maximized. To further maximize the electrostatic holding force 311, the positive and negative charged area should be nearly equivalent. To still further maximize the electrostatic holding force 311, the surface of the high permittivity dielectric material 305 (e.g., at the front side interface with the microelectronic components 102, 103) should be planarized (e.g., have a low roughness). When charged by voltage U, the electrostatic carrier assembly 300 may achieve a maximum holding force, which may discharge when exposed to discharging environments, such as long time periods without recharging, high temperatures, and chemicals or plasma. To minimize discharge, the electrostatic carrier 301 may further include environmental protection agents, such as surface treatments, modification of shape, inclusion of seals, or adaptation of processing hardware to enable continuous charging. The electrodes 309 may have any suitable size, spacing, and arrangement, as described below with reference to FIG. 12, and may depend on the design rules of the carrier 107.

FIGS. 9A-9F are side, cross-sectional views of various stages of an example microelectronic component assembly process using an electrostatic carrier, in accordance with various embodiments.

The processes of FIG. 9 may be performed at room temperature. FIG. 9A illustrates an electrostatic carrier assembly 300 including an electrostatic carrier 301 having a carrier 107, a high permittivity dielectric material 305, a plurality of electrodes 309, and conductive pathways 313 for charging, and a plurality of microelectronic components 102 subsequent to a pick and place head 115 providing microelectronic components 102 on the surface of the high permittivity dielectric material 305 (e.g., the carrier is reconstituted with dies). The pick and place head 115 may include vacuum pick-up, electrostatic pick-up, or dry adhesive pick, and may not include tape stretching and needle eject. FIG. 9B illustrates an assembly subsequent to the microelectronic components 102 being electrostatically coupled 311 to the electrostatic carrier 301 by coupling the plurality of electrodes 309 to a charger 307 via the conductive pathways 313 and charging the electrostatic carrier 301. FIG. 9C illustrates an assembly subsequent to electrostatically coupling 311 the microelectronic components 102 and removing the charger 307. Subsequent to electrostatically coupling 311 the microelectronic components 102 to the electrostatic carrier 301, the microelectronic components 102 may undergo additional processing, such as plasma activation, deionized water cleans, and/or drying through a spin dry 315. The electrostatic carrier 301 may further include a hydrophobic coating (not shown) on the front side surface of the high permittivity dielectric material 305 (e.g., between the high permittivity dielectric material 305 and the microelectronic components 102) to reduce discharge during a deionized water clean. The electrostatic carrier 301 may further include hardware to continuously charge the electrostatic carrier assembly 300 to prevent discharge during plasma activation and/or deionized water cleans (e.g., by pulling vacuum on the back side of the electrostatic carrier assembly 300 and the charging contacts (not shown) that couple to the conductive pathways 313 and charge the electrodes 309 continuously during the processing). FIG. 9D illustrates an assembly subsequent to discharging the electrostatic carrier assembly 300 to remove the electrostatic bonding forces 311, such that the microelectronic components 102 may be detached, individually or collectively. FIG. 9E illustrates an assembly subsequent to removal of a single microelectronic component 102 by the pick and place head 115. For example, the microelectronic components 102 may be transferred to a feeder tool (e.g., a chip-to-wafer placement tool) for direct bonding to a destination wafer. In some embodiments, the charger 307 for charging/discharging the electrostatic carrier 301 may be integrated into a feeder tool so that the electrostatic carrier 301 may be discharged and the microelectronic components 102 may be detached without requiring subsequent cleaning or risking an electrostatic event. FIG. 9F illustrates an assembly subsequent to recharging the electrostatic carrier 301 via the charger 307 and electrostatically recoupling 311 the remaining microelectronic components 102 to the electrostatic carrier 301 for further processing or for detach and removal at another time. In some embodiments, the electrostatic carrier 301 may include a unique identifier (e.g., wafer identification number (WID) on the carrier 107) to track an amount of time since charging such that the electrostatic carrier assembly 300 may be recharged prior to leakage based discharge or charge decay.

FIGS. 10A-10G are side, cross-sectional views of various stages of an example microelectronic component assembly process using an electrostatic carrier, in accordance with various embodiments. The processes of FIG. 10 may be performed at room temperature. FIG. 10A illustrates an electrostatic carrier assembly 300 including an electrostatic carrier 301 having a carrier 107, a high permittivity dielectric material 305, a plurality of electrodes 309, and conductive pathways 313 for charging, and a plurality of microelectronic components 102 subsequent to a pick and place head 115 providing microelectronic components 102 on the surface of the high permittivity dielectric material 305 (e.g., the carrier is reconstituted with dies). The pick and place head 115 may include vacuum pick-up, electrostatic pick-up, or dry adhesive pick. FIG. 10B illustrates an assembly subsequent to the microelectronic components 102 being electrostatically coupled 311 to the electrostatic carrier 301 by coupling the plurality of electrodes 309 to a charger 307 via the conductive pathways 313 and charging the electrostatic carrier 301. FIG. 10C illustrates an assembly subsequent to electrostatically coupling 311 the microelectronic components 102 and removing the charger 307. Subsequent to electrostatically coupling 311 the microelectronic components 102 to the electrostatically charged carrier 301, the microelectronic components 102 may undergo additional processing. FIG. 10D illustrates an assembly subsequent to flipping the assembly of FIG. 10C and aligning it with a destination wafer 109 including IC devices 111. The assembly of FIG. 10C may be aligned to the destination wafer 109, for example, using fiducials on the carrier 107. FIG. 10E illustrates an assembly subsequent to mating the microelectronic components 102 with the IC devices 111 on the destination wafer 109. FIG. 10F illustrates an assembly subsequent to discharging the electrostatic carrier assembly 300 to remove the electrostatic bonding forces 311, such that the microelectronic components 102 may be detached collectively. In some embodiments, the microelectronic components 102 may be coupled to the IC devices 111 via direct bonding prior to removal of the electrostatic carrier 301. FIG. 10G illustrates an assembly subsequent to detaching the microelectronic components 102 and removing the electrostatic carrier 301. In some embodiments, the microelectronic components 102 may be coupled to the IC devices 111 via direct bonding or undergo further processing, such as inspection and thermal anneal.

FIGS. 11A-11C are back side views and side view of an example arrangement of charging contacts on an electrostatic carrier, in accordance with various embodiments. FIG. 11A illustrates a back side view of charging contacts 317 on an electrostatic carrier 301 arranged in a grid array that may enable individual area, local area, or global charging and discharging. Although FIG. 11 illustrates the charging contacts 317 as protruding, the charging contacts may have any suitable form, including recessed. FIG. 11B illustrates a back side view of charging contacts 317 on an electrostatic carrier 301 having a centralized arrangement that may enable global charging and discharging. FIG. 11C illustrates that the charging contacts 317 of FIG. 11B may be activated by contacting retractable or addressable charging pins 319 on a charger 307 to charge and discharge the electrostatic carrier 301. In some embodiments, the placement and planarity of the electrostatic carrier 301 may be determined by a vacuum chuck 321 and kinematic features. In some embodiments, for example, in direct bonding processes, direct bonding equipment (e.g., a plasma activation tool, a hydration or spinneret chuck, a feeder tool, and a collective bond/debond module) may leverage a vacuum chuck and addressable charging pin array (e.g., the grid array of FIG. 11A) for local or individual charging and discharging. In such situations, a pick and place head may be hovered above an individual microelectronic component that is discharged and released just prior to pick up by the pick and place head so that adjacent microelectronic components are not impacted by removal of the individual microelectronic component. Further, in such situations, a universal bond head may remove a plurality of microelectronic components without impacting adjacent microelectronic components.

FIGS. 12A and 12B are top views of example arrangements of electrodes on a front side of an electrostatic carrier, in accordance with various embodiments. FIG. 12A illustrates a universal electrostatic carrier 301 that has electrodes 309A covering an entire front side surface area and is designed to electrostatically couple any size and shape of microelectronic components 102 (not shown) and anywhere on the front side surface area. FIG. 12B illustrates a specific patterning of electrodes 309B (e.g., in a grid array) where microelectronic components 102 (not shown) may be electrostatically coupled to the electrostatic carrier 301 according to the grid array. The specific patterning of electrodes 309B may enable specific microelectronic component 102 (not shown) matching to a specific IC device on a destination wafer. The specific patterning of electrodes 309B may allow for a maximum attraction force per microelectronic component area and may further allow for identifying a position of a particular microelectronic component 102 and repeating fiducials on the carrier 107. In some embodiments, the electrostatic carrier 301 may further include a hydrophilic material and/or a hydrophobic material on the high permittivity dielectric material at the microelectronic component interface to self-align the microelectronic components, as described below with reference to FIG. 14.

Figure 13A:
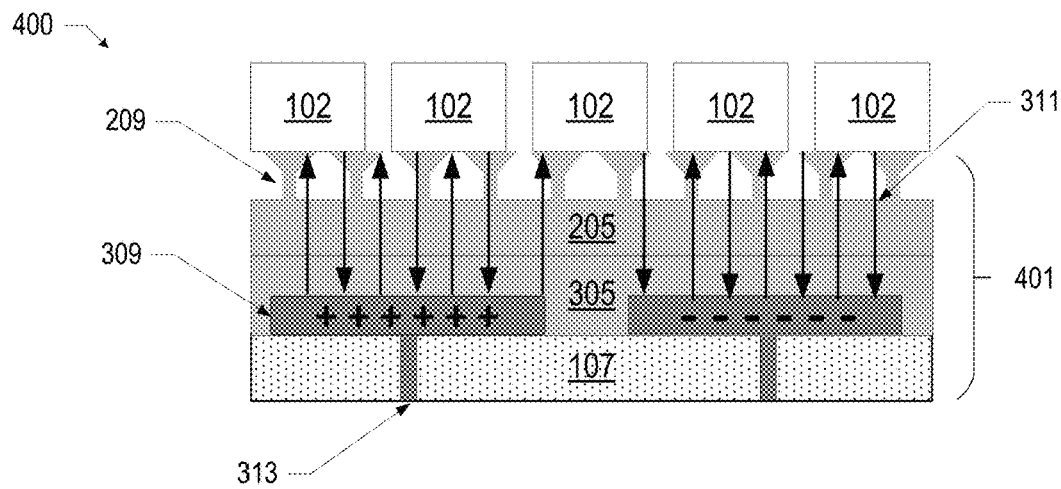
FIGS. 13A-13C are side, cross-sectional views of example textured, electrostatic carrier assemblies, in accordance with various embodiments.
Figure 13B:
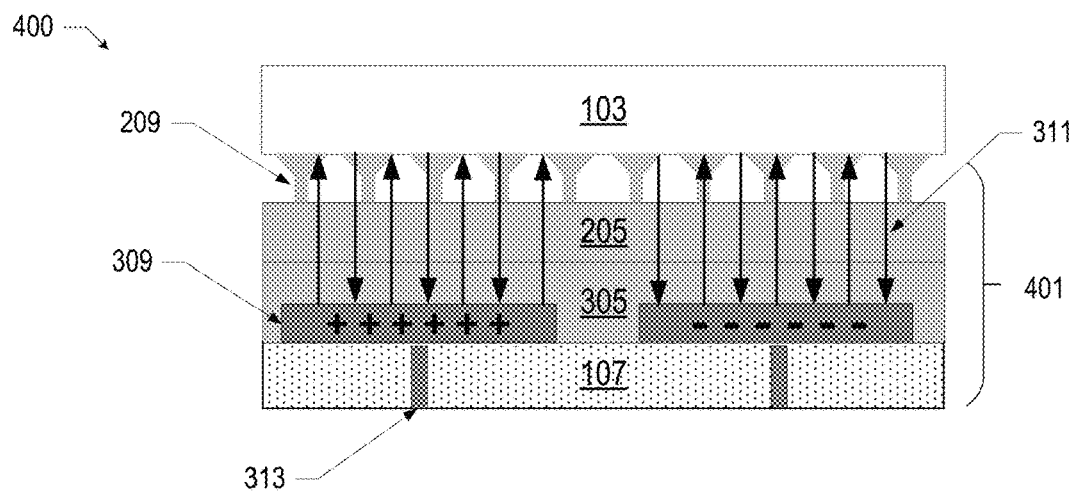
Figure 13C:
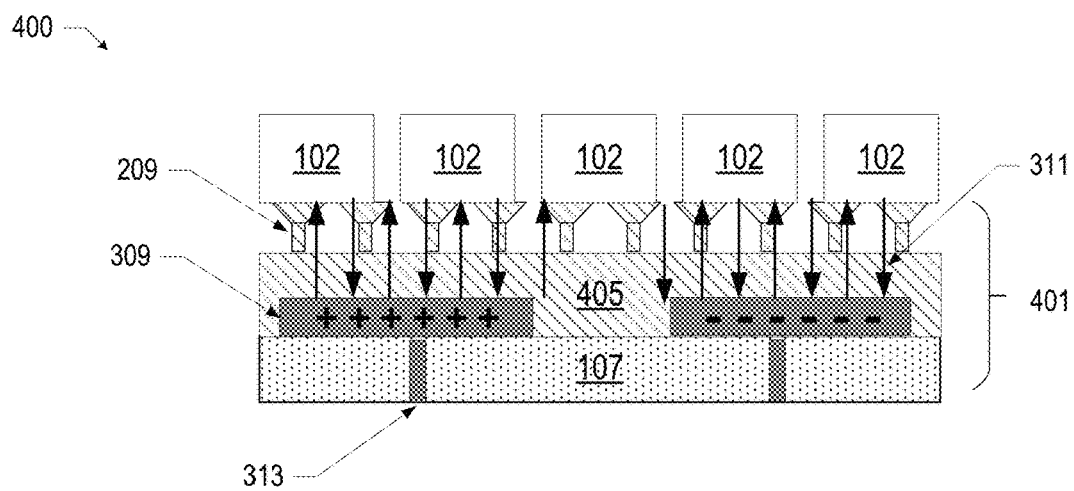

FIGS. 13A-13C are side, cross-sectional views of example textured-electrostatic carrier assemblies, in accordance with various embodiments. The textured-electrostatic carrier 401 combines the elements of the textured carrier 201 and the electrostatic carrier 301. As shown in FIG. 13A, a textured-electrostatic carrier assembly 400 may include a textured-electrostatic carrier 401 including a carrier 107, an high permittivity dielectric material 305, a plurality of electrodes 309, conductive pathways 313 for charging the electrodes 309, a textured material 205 having texturized microstructures 209, and a plurality of microelectronic components 102 mechanically coupled (e.g., via the texturized microstructures 209) and electrostatically coupled 311 to the textured-electrostatic carrier 401. FIG. 13B illustrates a textured-electrostatic carrier assembly 400 having a textured-electrostatic carrier 401 including a carrier 107, an high permittivity dielectric material 305, a plurality of electrodes 309, conductive pathways 313 for charging the electrodes 309, a textured material 205 having texturized microstructures 209, and a microelectronic component 103 mechanically coupled (e.g., via the texturized microstructures 209) and electrostatically coupled 311 to the textured-electrostatic carrier 401. FIG. 13C illustrates a textured-electrostatic carrier assembly 400 having a textured-electrostatic carrier 401 including a carrier 107, a textured-high permittivity dielectric material 405 having texturized microstructures 209, a plurality of electrodes 309, conductive pathways 313 for charging the electrodes 309, and a plurality of microelectronic components 102 mechanically coupled (e.g., via the texturized microstructures 209) and electrostatically coupled 311 to the textured-electrostatic carrier 401. In some embodiments, the textured, high permittivity dielectric material 405 may include a conductive core material, such as carbon nanotubes, copper wire, silver wire, or other similar metal structures, and a dielectric coating material, such as aluminum and oxygen (e.g., in the form of aluminum oxide), silicon and oxygen (e.g., in the formed of silicon oxide), silicon and nitrogen (e.g., in the form of silicon nitride), polyimide, hafnium and oxide, and combinations thereof that may extend vertically from the electrodes 309. The texturized microstructures with or without an electrically conductive core may have an elastic or viscoelastic deformation of approximately 3 microns and may accommodate for microelectronic component 102 thickness variation of +/−1.5 microns. A thickness of the dielectric coating may be minimized to maximize the electrostatic bonding force 311.

Figures 14A, 14B, 14C, 14D, 14E:
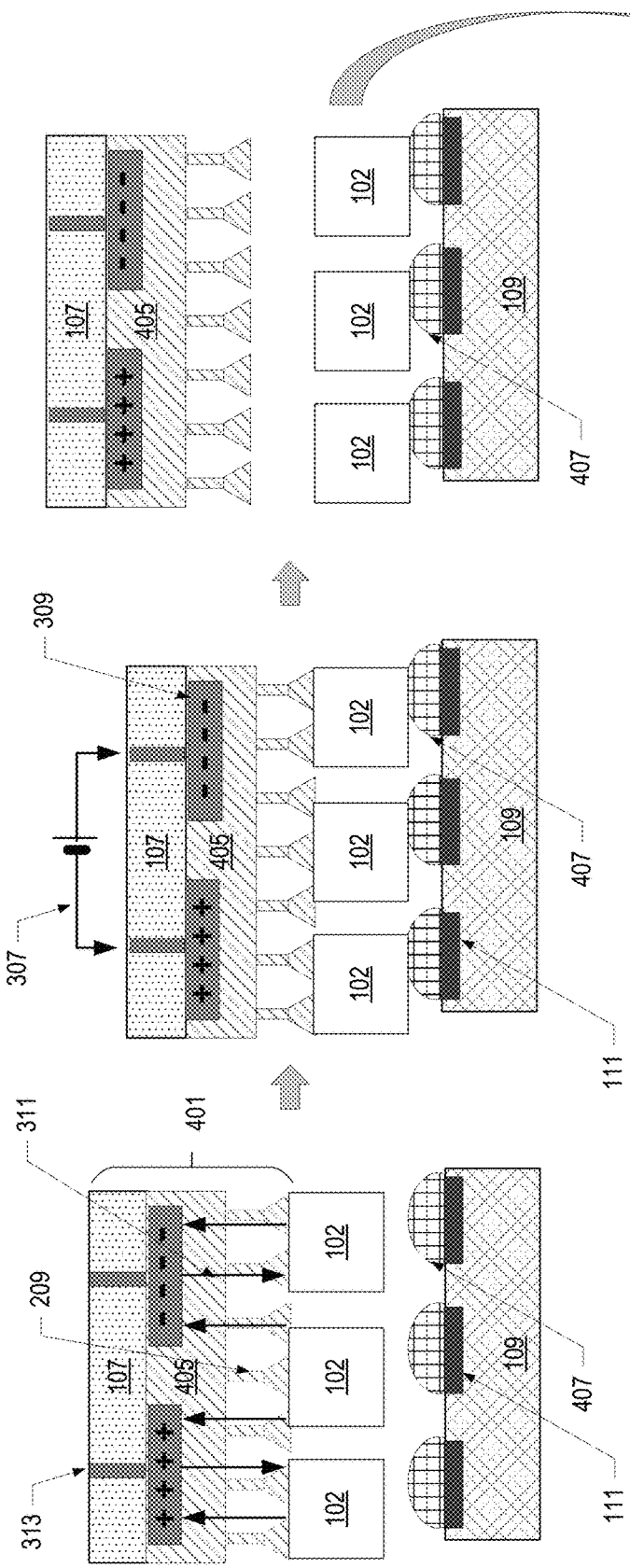
FIGS. 14A-14E are side, cross-sectional views of various stages of an example microelectronic component fluidic self-assembly process using a textured, electrostatic carrier, in accordance with various embodiments.

FIGS. 14A-43E are side, cross-sectional views of various stages of an example microelectronic component fluidic self-assembly process using a textured, electrostatic carrier, in accordance with various embodiments. The processes of FIG. 14 may be performed at room temperature. FIG. 14A illustrates a textured-electrostatic carrier assembly 400 including a textured-electrostatic carrier 401 having a carrier 107, a textured,-high permittivity dielectric material 405 having texturized microstructures 209, a plurality of electrodes 309, and conductive pathways 313 for charging the electrodes 309, and a plurality of microelectronic components 102 subsequent to providing the microelectronic components 102 on the textured-electrostatic carrier 401 (e.g., the carrier is reconstituted with dies), subsequent to the microelectronic components 102 being mechanically and electrostatically coupled 311 to the electrostatic carrier 301, and subsequent to flipping the textured-electrostatic carrier assembly 400 and aligning it with a destination wafer 109 including destination components 111 (e.g., IC devices) and a hydrophilic material 407 at the destination components 111 for the microelectronic components 102. In some embodiments, the destination wafer 109 may further include a hydrophobic material (e.g., a low surface energy such as fluorenes or micro-textures that prevent wetting and promote hydrophilic dewetting) (not shown) surrounding the destination components 111. FIG. 14B illustrates an assembly subsequent to mating the microelectronic components 102 with the IC devices 111 on the destination wafer 109 and discharging the textured-electrostatic carrier 401 via the charger 307 to remove the electrostatic bonding forces 311, such that the microelectronic components 102 may be detached individually or collectively. FIG. 14C illustrates an assembly subsequent to detaching the microelectronic components 102 and removing the textured-electrostatic carrier 401. FIG. 14D illustrates an assembly subsequent to the microelectronic components 102 self-aligning to the destination components 111 via the hydrophilic material 407. FIG. 14E illustrates an assembly subsequent to drying of the hydrophilic material 407. In some embodiments, the microelectronic components 102 may be coupled to the IC devices 111 via direct bonding or may undergo further processing, such as inspection and thermal anneal. Although FIGS. 14A-14E illustrate collectively self-alignment of microelectronic components 102 using a textured-electrostatic carrier 401, the microelectronic components 102 may be individually placed for self-alignment using a pick and place head as described above with reference to FIGS. 3 and 9.

Figure 14F:
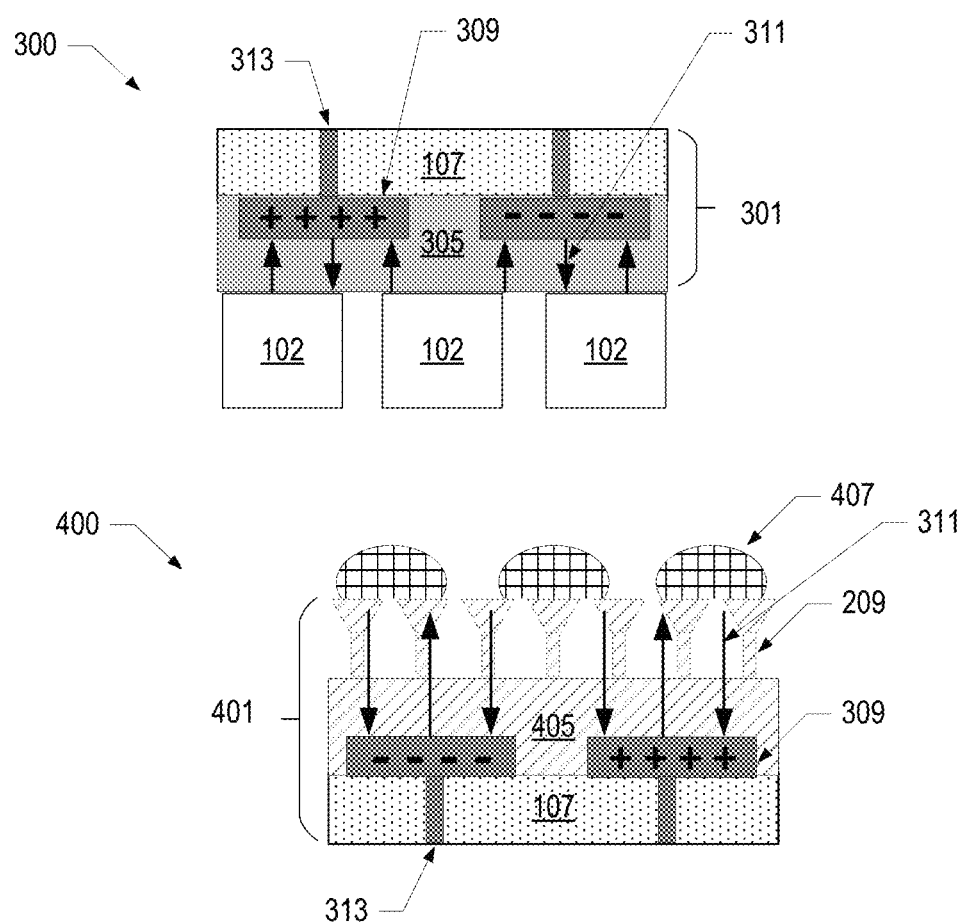
FIG. 14F is a side, cross-sectional view of an example microelectronic component fluidic self-assembly to a textured, electrostatic carrier, in accordance with various embodiments.

FIG. 14F is a side, cross-sectional view of an example microelectronic component fluidic self-assembly to a textured, electrostatic carrier, in accordance with various embodiments. The collective or individual self-alignment of microelectronic components 102 using a textured-electrostatic carrier 401 described with reference to FIGS. 14A-14E may be utilized to self-align microelectronic components 102 using a textured-electrostatic carrier 401. FIG. 14F illustrates a textured-electrostatic carrier assembly 400 including a textured-electrostatic carrier 401 having a carrier 107, a textured, high permittivity dielectric material 405 having texturized microstructures 209, a plurality of electrodes 309, conductive pathways 313 for charging the electrodes 309, and a hydrophilic material 407 at the top surface of the texturized microstructures 209. FIG. 14F further illustrates an electrostatic carrier assembly 300 having an electrostatic carrier 301 including a carrier 107, a high permittivity dielectric material 305, a plurality of electrodes 309, conductive pathways 313 for charging the electrodes 309, and a plurality of microelectronic components 102 electrostatically coupled 311 to the electrostatic carrier 301. As shown in FIG. 14F, the electrostatic carrier assembly 300 has been flipped and the microelectronic components 102 generally aligned with the hydrophilic material 407 on the textured-electrostatic carrier assembly 400. In some embodiments, the textured-electrostatic carrier assembly 400 may further include a hydrophobic material (e.g., a low surface energy such as fluorenes or micro-textures that prevent wetting and promote hydrophilic dewetting)(not shown) surrounding the hydrophilic material 407. The microelectronic components 102 may be placed on the textured-electrostatic carrier assembly 400 via the processes described in FIGS. 14A-14E.

Figures 15A, 15B:
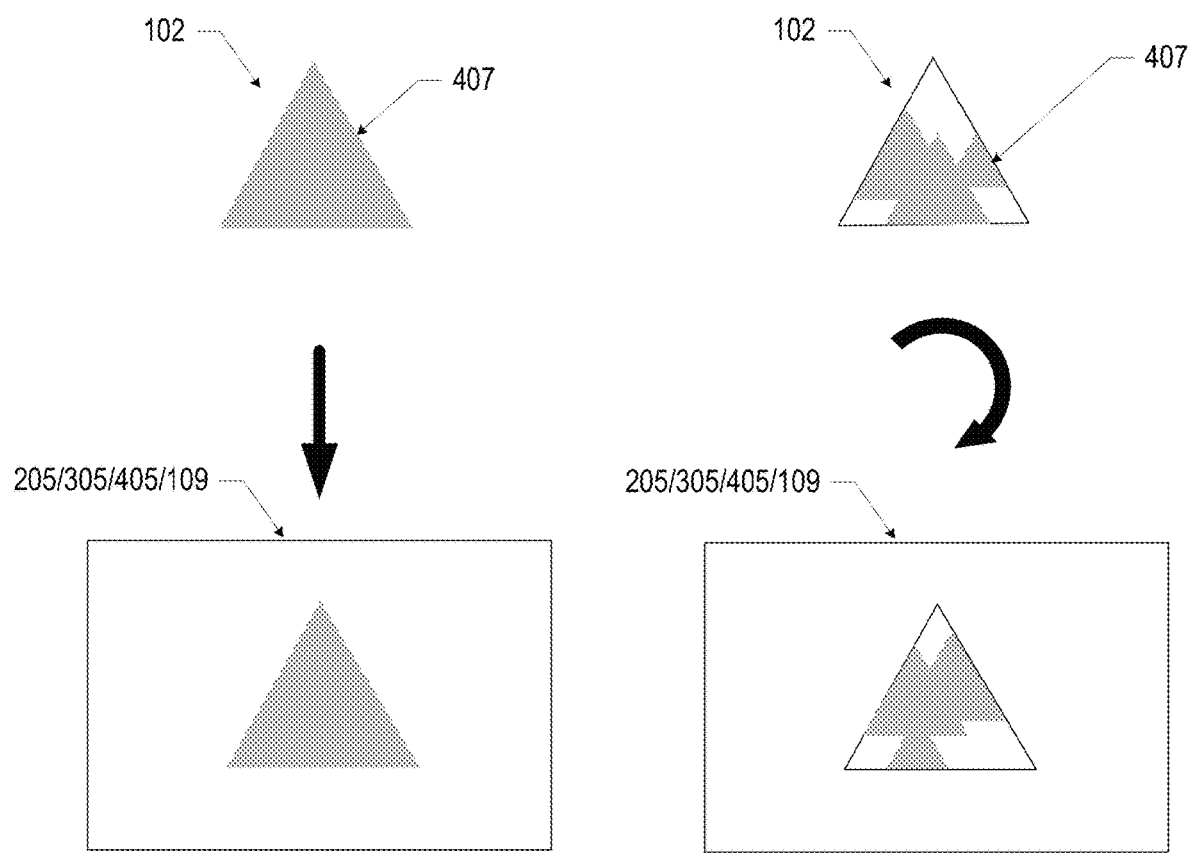
FIGS. 15A and 15B are top view schematic illustrations of example orientation preferences for a microelectronic component fluidic self-assembly process, in accordance with various embodiments.

FIGS. 15A and 15B are top view schematic illustrations of example orientation preferences for a microelectronic component fluidic self-assembly process, in accordance with various embodiments. FIG. 15A illustrates an equilateral triangular-shaped microelectronic component 102 with a hydrophilic material 407 having no orientation preference to a carrier (e.g., textured material 205, high permittivity dielectric material 305, or textured-high permittivity dielectric material 405) or a destination wafer 109, such that the microelectronic component 102 may be oriented rotated 60 degrees, rotated 120 degrees, or not rotated. FIG. 15B illustrates an equilateral triangular-shaped microelectronic component 102 with a hydrophilic material 407 having a deterministic orientation preference to a carrier (e.g., textured material 205, high permittivity dielectric material 305, or textured-high permittivity dielectric material 405) or a destination wafer 109, such that the microelectronic component 102 must be rotated 60 degrees to be oriented with the carrier or destination wafer 109. In some embodiments, the carrier (e.g., textured material 205, high permittivity dielectric material 305, or textured-high permittivity dielectric material 405) may include a hydrophilic material and/or a hydrophobic material or microstructure to aid in self-alignment and orientation upon pick up by, or upon set down on, the destination wafer.

Figure 16:
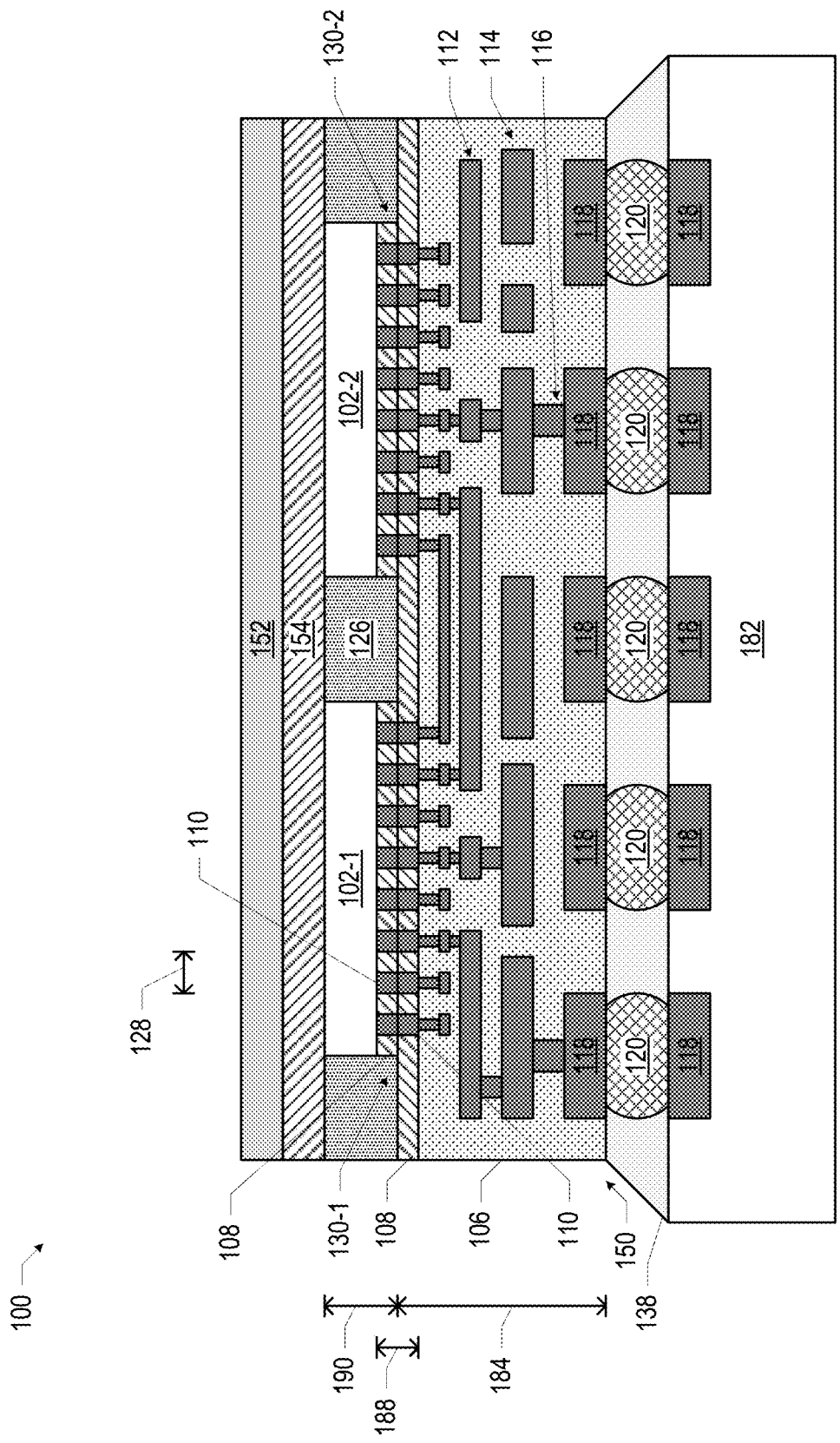
FIG. 16 is a side, cross-sectional view of an example microelectronic assembly including direct bonding, in accordance with various embodiments.
Figure 17:
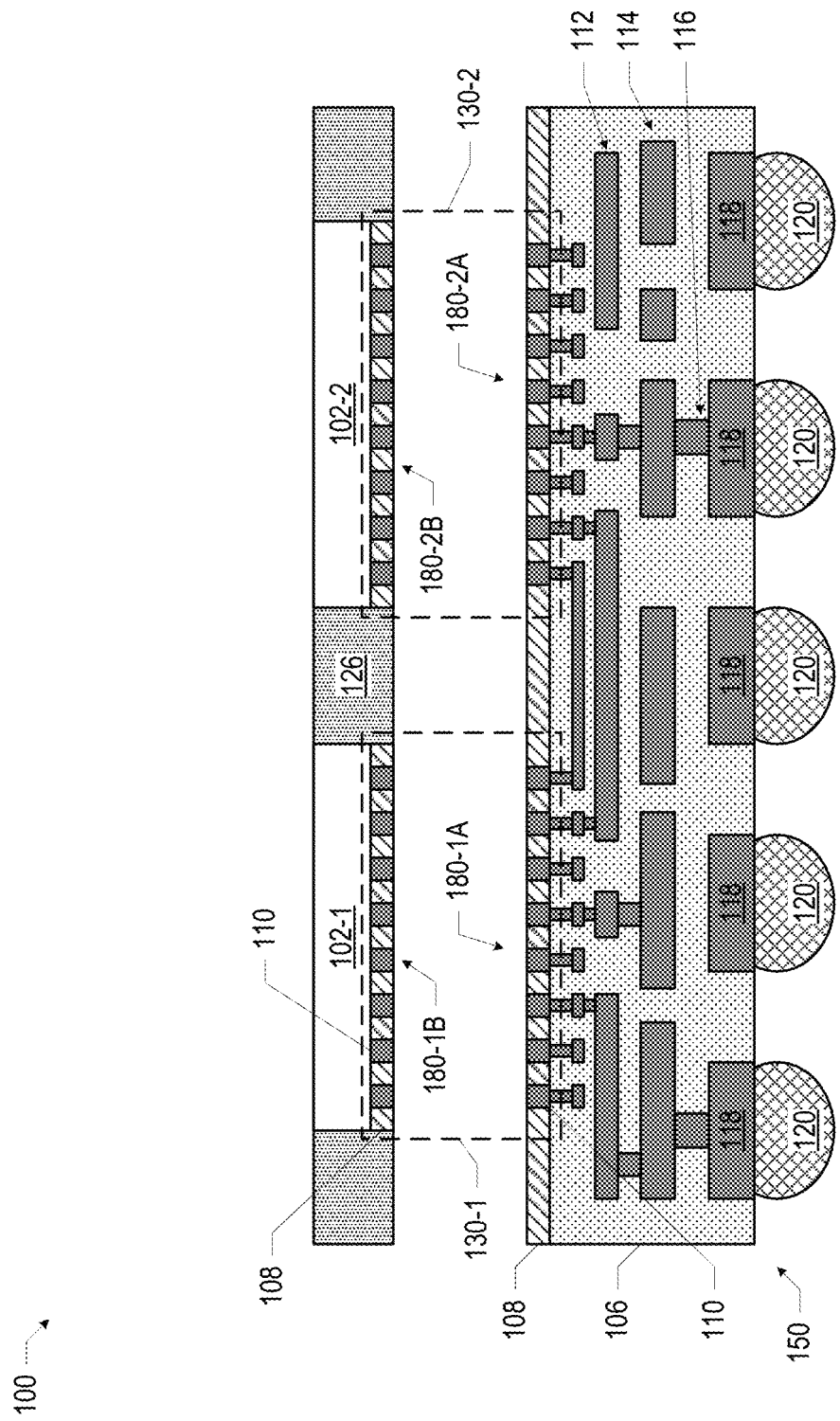
FIG. 17 is a side, cross-sectional exploded view of a portion of the microelectronic assembly of FIG. 16, in accordance with various embodiments.

FIG. 16 is a side, cross-sectional view of a microelectronic assembly 100, in accordance with various embodiments. The microelectronic assembly 100 may include an interposer 150 coupled to a microelectronic component 102-1 by a direct bonding (DB) region 130-1. In particular, as illustrated in FIG. 17, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150. In the microelectronic assembly 100 of FIG. 16, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As used herein, the term "direct bonding" is used to include metal-to-metal bonding techniques (e.g., copper-to-copper bonding, or other techniques in which the DB contacts 110 of opposing DB interfaces 180 are brought into contact first, then subject to heat and compression) and hybrid bonding techniques (e.g., techniques in which the DB dielectric 108 of opposing DB interfaces 180 are brought into contact first, then subject to heat and sometimes compression, or techniques in which the DB contacts 110 and the DB dielectric 108 of opposing DB interfaces 180 are brought into contact substantially simultaneously, then subject to heat and compression). In such techniques, the DB contacts 110 and the DB dielectric 108 at one DB interface 180 are brought into contact with the DB contacts 110 and the DB dielectric 108 at another DB interface 180, respectively, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder or soft passivating metal may be used in a DB interconnect to accommodate planarity, and this solder or soft metal may become an intermetallic compound (IMC) in the DB region 130 during processing. DB interconnects may be capable of reliably conducting a higher current than other types of interconnects; for example, some conventional solder interconnects may form large volumes of brittle IMCs when current flows, and the maximum current provided through such interconnects may be constrained to mitigate mechanical failure.

A DB dielectric 108 may include one or more dielectric materials, such as one or more inorganic dielectric materials. For example, a DB dielectric 108 may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a complementary DB interface 180 may include a metal pad (e.g., a copper pad) recessed in a dielectric. A DB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIGS. 16 and 17 also illustrate a microelectronic component 102-2 coupled to the interposer 150 by a DB region 130-2 (via the DB interfaces 180-2A and 180-2B, as shown in FIG. 17). Although FIG. 16 depicts a particular number of microelectronic components 102 coupled to the interposer 150 by DB regions 130, this number and arrangement are simply illustrative, and a microelectronic assembly 100 may include any desired number and arrangement of microelectronic components 102 coupled to an interposer 150 by DB regions 130. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures (e.g., in accordance with any of the embodiments discussed below with reference to FIG. 3). Similarly, although a single reference numeral "110" is used to refer to the DB contacts of multiple different DB interfaces 180 (and different DB regions 130), this is simply for ease of illustration, and the DB contacts 110 of different DB interfaces 180 (even within a single DB region 130) may have different materials and/or structures.

The interposer 150 may include an insulating material 106 (e.g., one or more dielectric materials formed in multiple layers, as known in the art) and one or more conductive pathways 112 through the insulating material 106 (e.g., including conductive lines 114 and/or conductive vias 116, as shown). In some embodiments, the insulating material 106 of the interposer 150 includes an inorganic dielectric material, such as silicon and nitrogen (e.g., in the form of silicon nitride); silicon and oxygen (e.g., in the form of silicon oxide); silicon and carbon (e.g., in the form of silicon carbide); silicon, carbon, and oxygen (e.g., in the form of silicon oxycarbide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); or silicon, oxygen, carbon, and hydrogen (e.g., in the form of tetraethyl orthosilicate (TEOS)); and combinations thereof. In some embodiments, the insulating material 106 of the interposer 150 includes an insulating metal oxide, such as aluminum and oxygen (e.g., in the form of aluminum oxide); titanium and oxygen (e.g., in the form of titanium oxide); hafnium and oxygen (e.g., in the form of hafnium oxide); zirconium and oxygen (e.g., in the form of zirconium oxide); niobium and oxygen (e.g., in the form of niobium oxide); or tantalum and oxygen (e.g., in the form of tantalum oxide); and combinations thereof. In some embodiments, the interposer 150 may be semiconductor-based (e.g., silicon-based) or glass-based. In some embodiments, the interposer 150 is a silicon wafer or die. In some embodiments, the interposer 150 may be a silicon-on-insulator (SOI) and may further include layers of silicon and germanium (e.g., in the form of silicon germanium), gallium and nitrogen (e.g., in the form of gallium nitride), indium and phosphorous (e.g., in the form of indium phosphide), among others. In some embodiments, the insulating material 106 of the interposer 150 may be an organic material, such as polyimide or polybenzoxazole, or may include an organic polymer matrix (e.g., epoxide) with a filler material (which may be inorganic, such as silicon nitride, silicon oxide, or aluminum oxide). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Conventional integrated circuit packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as disclosed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different DB contacts 110 potentially in different DB regions 130, as discussed further below). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 16 and 17 illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example.

In some embodiments, a microelectronic component 102 may include an IC die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 19. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a DB region 130 (and further through intervening microelectronic components 102). In some embodiments, a microelectronic component 102 may take the form of any of the embodiments of the interposer 150 herein. Although the microelectronic components 102 of the microelectronic assembly 100 of FIG. 16 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component.

Additional components (not shown), such as surface-mount resistors, capacitors, and/or inductors, may be disposed on the top surface or the bottom surface of the interposer 150, or embedded in the interposer 150. The microelectronic assembly 100 of FIG. 16 also includes a support component 182 coupled to the interposer 150. In the particular embodiment of FIG. 16, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 16 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 16 may also include a thermal interface material (TIM) 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 152, where it may be spread and/or dissipated. Some embodiments of the microelectronic assembly 100 of FIG. 16 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 16 may also include a heat transfer structure 152. The heat transfer structure 152 may be used to move heat away from one or more of the microelectronic components 102 (e.g., so that the heat may be more readily dissipated). The heat transfer structure 152 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 152 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 50 nanometers and 5 microns. In some embodiments, a thickness 190 of a microelectronic component 102 may be between 5 microns and 800 microns. In some embodiments, a pitch 128 of the DB contacts 110 in a DB region 130 may be less than 20 microns (e.g., between 0.1 microns and 20 microns).

The microelectronic components 102, 103, 109 and microelectronic assemblies 100 disclosed herein may be included in any suitable electronic component. FIGS. 18-21 illustrate various examples of apparatuses that may include, or be included in, as suitable, any of the microelectronic components 102, 103, 109 and microelectronic assemblies 100 disclosed herein.

Figure 18:
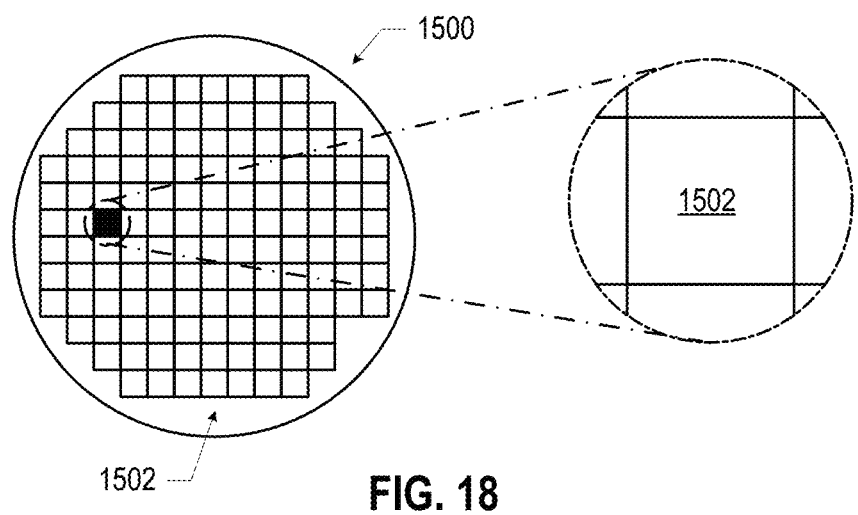
FIG. 18 is a top view of a wafer and dies that may be included in a microelectronic component in accordance with any of the embodiments disclosed herein.

FIG. 18 is a top view of a wafer 1500 and dies 1502 that may be included in any of the microelectronic components 102 disclosed herein. For example, a wafer 1500 may serve as microelectronic component 103 and/or target wafer 109, and a die 1502 may serve as a microelectronic component 102 or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 19, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 21) or other logic that is configured to store information in the memory devices or execute instructions stored in the memory array.

Figure 19:
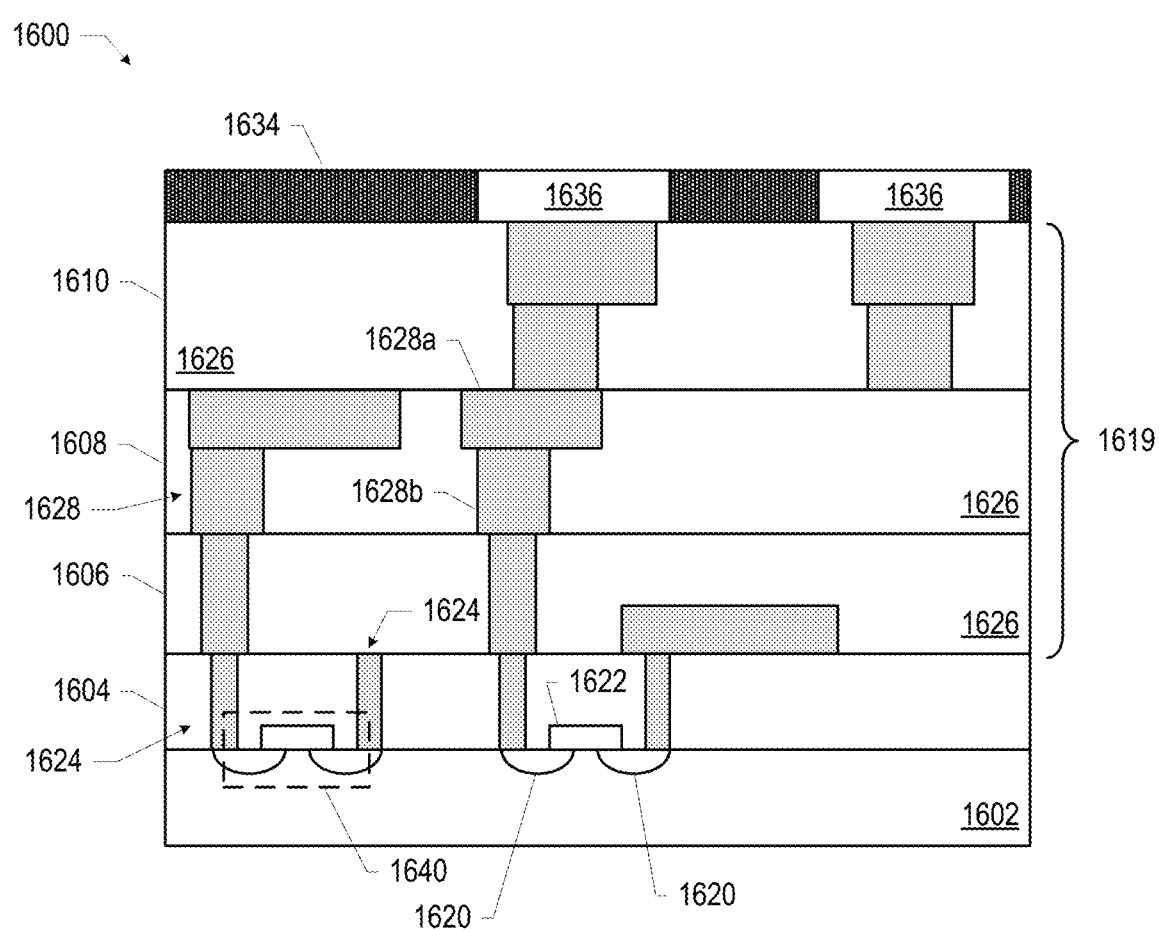
FIG. 19 is a side, cross-sectional view of an integrated circuit (IC) device that may be included in a microelectronic component in accordance with any of the embodiments disclosed herein.

FIG. 19 is a side, cross-sectional view of an IC device 1600 that may be included in any of the microelectronic components 102 disclosed herein. For example, an IC device 1600 (e.g., as part of a die 1502, as discussed above with reference to FIG. 18) may serve as a microelectronic component 102, or may be included in a microelectronic component 102. One or more of the IC devices 1600 may be included in one or more dies 1502 (FIG. 18). The IC device 1600 may be formed on a substrate 1602 (e.g., the wafer 1500 of FIG. 18) and may be included in a die (e.g., the die 1502 of FIG. 18). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 18) or a wafer (e.g., the wafer 1500 of FIG. 18).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 19 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions

1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 19 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 19). Although a particular number of interconnect layers 1606-1610 is depicted in FIG. 19, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 19. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 19. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 19, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. In some embodiments, the IC device 1600 may not include a solder resist material and instead may include a direct bonding region as described above with reference to FIGS. 16 and 17 (e.g., the direct bonding region 130).

Figure 20:
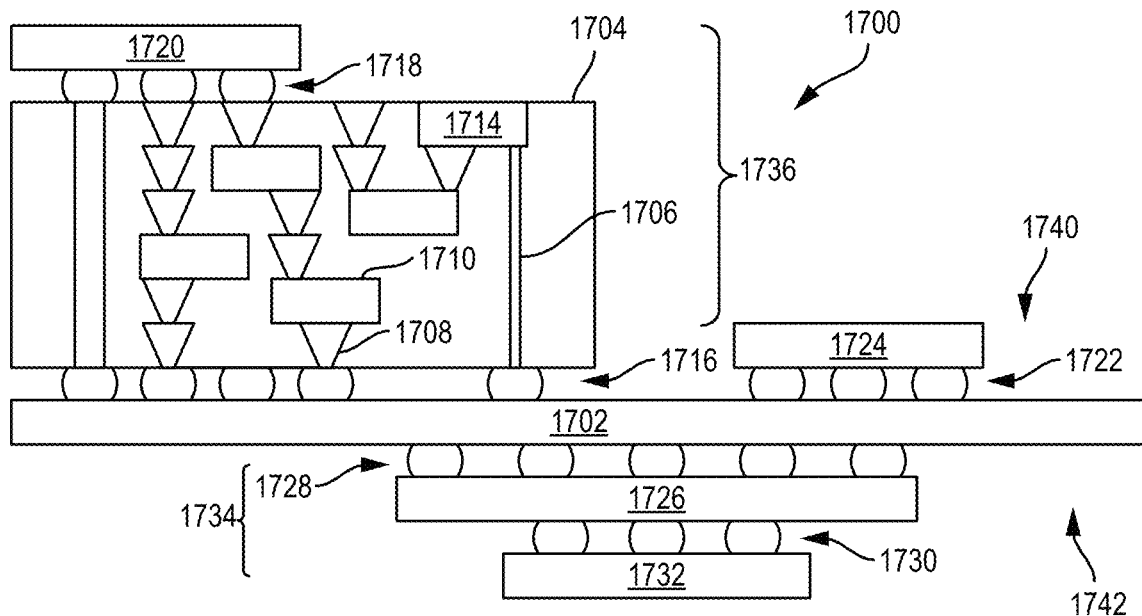
FIG. 20 is a side, cross-sectional view of an IC device assembly that may include a microelectronic assembly in accordance with any of the embodiments disclosed herein.

FIG. 20 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 20 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 20), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 20, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 18), an IC device (e.g., the IC device 1600 of FIG. 19), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 20, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 20 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 21:
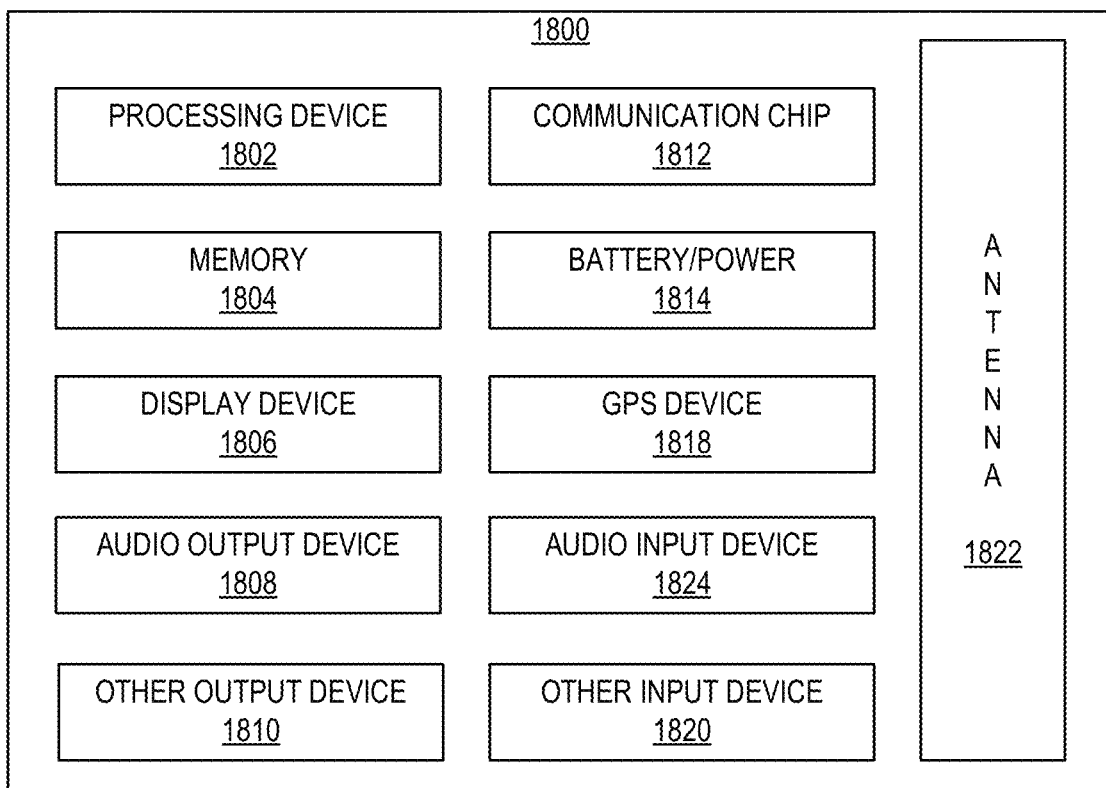
FIG. 21 is a block diagram of an example electrical device that may include a microelectronic assembly in accordance with any of the embodiments disclosed herein.

FIG. 21 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 21 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 21, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UM B) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1A is a carrier assembly, including a carrier; a textured material coupled to the carrier and including texturized microstructures; and a plurality of microelectronic components mechanically and removably coupled to the texturized microstructures.

Example 2A may include the subject matter of Example 1A, and may further specify that the textured material is a dry adhesive material.

Example 3A may include the subject matter of Example 2A, and may further specify that a shape of the texturized microstructures of the dry adhesive material includes one or more of a pillar, a capped pillar, a sphere, a dome, a suction cup, and a tilted suction cup.

Example 4A may include the subject matter of Example 2A, and may further specify that the texturized microstructures are imprinted, molded, lithographically patterned, or laminated on the dry adhesive material.

Example 5A may include the subject matter of Example 2A, and may further specify that a thickness of the texturized microstructures is between 100 nanometers and 150 microns.

Example 6A may include the subject matter of Example 1A, and may further specify that the textured material includes an actuatable material that generates the texturized microstructures upon activation.

Example 7A may include the subject matter of Example 6A, and may further specify that the actuatable material is activated by one or more of ultraviolet radiation, increased temperature, and infrared light.

Example 8A may include the subject matter of Example 6A, and may further specify that the actuatable material includes an elastomer, a rubber, a urethane, a urethane copolymer, a polyurethane, an acrylate, an acrylate copolymer, a silicone, a silicone copolymer, a perfluoroelastomer, and combinations thereof.

Example 9A may include the subject matter of Example 1A, and may further specify that a material of the carrier includes glass, silicon, or a semi-conductor material.

Example 10A may include the subject matter of Example 1A, and may further specify that the microelectronic components are individually removable.

Example 11A is a carrier assembly, including a carrier; a patterned, textured material coupled to the carrier and including texturized microstructures; and a plurality of microelectronic components mechanically and removably coupled to the texturized microstructures.

Example 12A may include the subject matter of Example 11A, and may further specify that the textured material is a dry adhesive material.

Example 13A may include the subject matter of Example 12A, and may further specify that a shape of the texturized microstructures of the dry adhesive material includes one or more of a pillar, a capped pillar, a sphere, a dome, a suction cup, and a tilted suction cup.

Example 14A may include the subject matter of Example 11A, and may further specify that the textured material includes an actuatable material that generates the texturized microstructures upon activation.

Example 15A may include the subject matter of Example 14A, and may further specify that the actuatable material is activated by one or more of ultraviolet radiation, increased temperature, and infrared light.

Example 16A may include the subject matter of Example 14A, and may further specify that the actuatable material includes an elastomer, a rubber, a urethane, a urethane copolymer, a polyurethane, an acrylate, an acrylate copolymer, a silicone, a silicone copolymer, a perfluoroelastomer, and combinations thereof.

Example 17A is a carrier assembly, including a carrier including a textured material having texturized microstructures; and a plurality of microelectronic components mechanically and removably coupled to the texturized microstructures.

Example 18A may include the subject matter of Example 11A, and may further specify that a footprint of the texturized microstructures includes a rectangular-shape, a circular-shape, a cross-shape, an oval-shape, a ring-shape, or an octagonal-shape, or any combination thereof.

Example 19A may include the subject matter of Example 17A, and may further specify that the texturized microstructures are arranged in a grid array, a hexagonal array, or a face-centered cubic array.

Example 20A may include the subject matter of Example 17A, and may further specify that the microelectronic components are collectively removable.

Example 1B is a carrier assembly, including a carrier having a front side and an opposing back side; an electrode on the front side of the carrier; a high permittivity dielectric material on the electrode and the carrier; a charging contact on the back side of the carrier electrically coupled to the electrode; and a plurality of microelectronic components electrostatically coupled to the front side of the carrier.

Example 2B may include the subject matter of Example 1B, and may further specify that the high permittivity dielectric material is compatible with semiconductor processing.

Example 3B may include the subject matter of Example 1B, and may further specify that a material of the carrier includes glass, silicon, or a semi-conductor material.

Example 4B may include the subject matter of Example 1B, and may further specify that the charging contact is one of a plurality of charging contacts, and wherein the plurality of charging contacts is arranged in a grid array on the back side of the carrier.

Example 5B may include the subject matter of Example 1B, and may further specify that the charging contact is one of a plurality of charging contacts, and wherein the plurality of charging contacts is arranged centrally on the back side of the carrier.

Example 6B may include the subject matter of Example 1B, and may further specify that the electrode is one of a plurality of electrodes, and wherein the plurality of electrodes is arranged in a grid array on the front side of the carrier.

Example 7B may include the subject matter of Example 1B, and may further specify that the electrode is one of a plurality of electrodes, and wherein the plurality of electrodes covers an entire surface area of the front side of the carrier.

Example 8B may include the subject matter of Example 1B, and may further specify that the microelectronic components are individually removable.

Example 9B may include the subject matter of Example 1B, and may further specify that the charging contact on the back side of the carrier is electrically coupled to the electrode by a through carrier via.

Example 10B may include the subject matter of Example 1B, and may further specify that the carrier includes a silicon material, and wherein the charging contact on the back side of the carrier is electrically coupled to the electrode by conductive pathways through the silicon material.

Example 11B is a carrier assembly, including a carrier having a front side and an opposing back side; a plurality of electrodes on the front side of the carrier; a high permittivity dielectric material on the plurality of electrodes and the carrier; a plurality of charging contacts on the back side of the carrier coupled to the plurality of electrodes; and a microelectronic component electrostatically coupled to the front side of the carrier.

Example 12B may include the subject matter of Example 11B, and may further include a redistribution layer on the carrier.

Example 13B may include the subject matter of Example 12B, and may further specify that two or more electrodes of the plurality of electrodes are coupled via conductive pathways in the redistribution layer.

Example 14B may include the subject matter of Example 11B, and may further specify that the plurality of electrodes are individually chargeable.

Example 15B may include the subject matter of Example 11B, and may further specify that the plurality of electrodes are collectively chargeable.

Example 16B may include the subject matter of Example 11B, and may further include a hydrophilic material and/or a hydrophobic material on the high permittivity dielectric material at the front side of the carrier.

Example 17B is a carrier assembly, including a carrier having a front side and an opposing back side; a plurality of electrodes on the front side of the carrier; a high permittivity dielectric material on the plurality of electrodes and the carrier; a plurality of charging contacts on the back side of the carrier coupled to the plurality of electrodes; and a plurality of microelectronic components electrostatically coupled to the front side of the carrier and arranged in a pattern for mating to a target wafer having an integrated circuit (IC) pattern.

Example 18B may include the subject matter of Example 17B, and may further specify that a surface of the high permittivity dielectric material at the front side of the carrier is planarized.

Example 19B may include the subject matter of Example 17B, and may further specify that the microelectronic components are collectively removable.

Example 20B may include the subject matter of Example 17B, and may further specify that the microelectronic components are individually removable.

Example 1C is a carrier assembly, including a carrier having a front side and an opposing back side; a plurality of electrodes on the front side of the carrier; a high permittivity dielectric material on the plurality of electrodes and the carrier, wherein the high permittivity dielectric material includes texturized microstructures; a plurality of charging contacts on the back side of the carrier coupled to the plurality of electrodes; and a plurality of microelectronic components mechanically and electrostatically coupled to the front side of the carrier.

Example 2C may include the subject matter of Example 1C, and may further specify that the high permittivity dielectric material includes a conductive core material and a dielectric coating material.

Example 3C may include the subject matter of Example 2C, and may further specify that the conductive core material includes carbon nanotubes, copper wire, silver wire, or other metal structures.

Example 4C may include the subject matter of Example 2C, and may further specify that the dielectric coating material includes aluminum and oxygen, silicon and oxygen, silicon and nitrogen, polyimide, hafnium and oxide, and combinations thereof.

Example 5C may include the subject matter of Example 1C, and may further include a hydrophilic material and/or a hydrophobic material on the high permittivity dielectric material at the front side of the carrier.

Example 6C may include the subject matter of Example 1C, and may further specify that the microelectronic components are collectively removable.

Example 7C may include the subject matter of Example 1C, and may further specify that the microelectronic components are individually removable.

Example 8C is a carrier assembly, including a carrier having a front side and an opposing back side; a plurality of electrodes on the front side of the carrier; a high permittivity dielectric material on the plurality of electrodes and the carrier, wherein the high permittivity dielectric material includes texturized microstructures; a plurality of charging contacts on the back side of the carrier coupled to the plurality of electrodes; and a plurality of microelectronic components mechanically and electrostatically coupled to the front side of the carrier and arranged in a pattern for mating to a target wafer having an integrated circuit (IC) pattern.

Example 9C may include the subject matter of Example 8C, and may further specify that the high permittivity dielectric material includes a conductive core material and a dielectric coating material.

Example 10C may include the subject matter of Example 9C, and may further specify that the conductive core material includes carbon nanotubes, copper wire, silver wire, or other metal structures.

Example 11C may include the subject matter of Example 9C, and may further specify that the dielectric coating material includes aluminum and oxygen, silicon and oxygen, silicon and nitrogen, polyimide, hafnium and oxide, and combinations thereof.

Example 12C may include the subject matter of Example 8C, and may further include a hydrophilic material and/or a hydrophobic material on the high permittivity dielectric material at the front side of the carrier to facilitate fluidic self-assembly to precise positions.

Example 13C may include the subject matter of Example 8C, and may further specify that the microelectronic components are collectively removable.

Example 14C may include the subject matter of Example 8C, and may further specify that the microelectronic components are individually removable.

Example 15C is a carrier assembly, including: a carrier having a front side and an opposing back side; a plurality of electrodes on the front side of the carrier; a high permittivity dielectric material on the plurality of electrodes and the carrier, wherein the high permittivity dielectric material includes texturized microstructures; a plurality of charging contacts on the back side of the carrier coupled to the plurality of electrodes; and a microelectronic component mechanically and electrostatically coupled to the front side of the carrier.

Example 16C may include the subject matter of Example 15C, and may further specify that the high permittivity dielectric material includes a conductive core material and a dielectric coating material.

Example 17C may include the subject matter of Example 16C, and may further specify that the conductive core material includes carbon nanotubes, copper wire, silver wire, or other metal structures.

Example 18C may include the subject matter of Example 16C, and may further specify that the dielectric coating material includes aluminum and oxygen, silicon and oxygen, silicon and nitrogen, polyimide, hafnium and oxide, and combinations thereof.

Example 19C may include the subject matter of Example 15C, and may further include a hydrophilic material and/or a hydrophobic material on the high permittivity dielectric material at the front side of the carrier.

Example 20C may include the subject matter of Example 15C, and may further specify that the plurality of electrodes are collectively chargeable and dischargeable.

The invention claimed is:
1. A carrier assembly, comprising:
a carrier having a front side and an opposing back side;

a plurality of electrodes on the front side of the carrier;
a dielectric material, having a relative permittivity greater than 1, on the plurality of electrodes and the carrier, wherein the dielectric material includes texturized microstructures comprising a plurality of capped pillars;
a plurality of charging contacts on the back side of the carrier coupled to the plurality of electrodes; and
a plurality of microelectronic components mechanically and electrostatically coupled to caps of the plurality of capped pillars.

2. The carrier assembly of claim 1, wherein the dielectric material includes a conductive core material and a dielectric coating material.

3. The carrier assembly of claim 2, wherein the conductive core material includes carbon nanotubes, copper wire, silver wire, or other metal structures.

4. The carrier assembly of claim 2, wherein the dielectric coating material includes aluminum and oxygen, silicon and oxygen, silicon and nitrogen, polyimide, hafnium and oxide, and combinations thereof.

5. The carrier assembly of claim 1, further comprising:
a hydrophilic material and/or a hydrophobic material on the dielectric material at the front side of the carrier.

6. The carrier assembly of claim 1, wherein the microelectronic components are collectively removable.

7. The carrier assembly of claim 1, wherein the microelectronic components are individually removable.

8. A carrier assembly, comprising:
a carrier having a front side and an opposing back side;
a plurality of electrodes on the front side of the carrier;
a dielectric material, having a relative permittivity greater than 1, on the plurality of electrodes and the carrier, wherein the dielectric material includes texturized microstructures comprising a plurality of capped pillars;
a plurality of charging contacts on the back side of the carrier coupled to the plurality of electrodes; and
a plurality of microelectronic components mechanically and electrostatically coupled to caps of the plurality of capped pillars and arranged in a pattern for mating to a target wafer having an integrated circuit (IC) pattern.

9. The carrier assembly of claim 8, wherein the dielectric material includes a conductive core material and a dielectric coating material.

10. The carrier assembly of claim 9, wherein the conductive core material includes carbon nanotubes, copper wire, silver wire, or other metal structures.

11. The carrier assembly of claim 9, wherein the dielectric coating material includes aluminum and oxygen, silicon and oxygen, silicon and nitrogen, polyimide, hafnium and oxide, and combinations thereof.

12. The carrier assembly of claim 8, further comprising:
a hydrophilic material and/or a hydrophobic material on the dielectric material at the front side of the carrier to facilitate fluidic self-assembly to precise positions.

13. The carrier assembly of claim 8, wherein the microelectronic components are collectively removable.

14. The carrier assembly of claim 8, wherein the microelectronic components are individually removable.

15. A carrier assembly, comprising:
a carrier having a front side and an opposing back side;
a plurality of electrodes on the front side of the carrier;
a dielectric material, having a relative permittivity greater than 1, on the plurality of electrodes and the carrier, wherein the dielectric material includes texturized microstructures comprising a plurality of capped pillars;
a plurality of charging contacts on the back side of the carrier coupled to the plurality of electrodes; and
a microelectronic component mechanically and electrostatically coupled to caps of the plurality of capped pillars.

16. The carrier assembly of claim 15, wherein the dielectric material includes a conductive core material and a dielectric coating material.

17. The carrier assembly of claim 16, wherein the conductive core material includes carbon nanotubes, copper wire, silver wire, or other metal structures.

18. The carrier assembly of claim 16, wherein the dielectric coating material includes aluminum and oxygen, silicon and oxygen, silicon and nitrogen, polyimide, hafnium and oxide, and combinations thereof.

19. The carrier assembly of claim 15, further comprising:
a hydrophilic material and/or a hydrophobic material on the dielectric material at the front side of the carrier.

20. The carrier assembly of claim 15, wherein the plurality of electrodes are collectively chargeable and dischargeable.

* * * * *